(12) United States Patent
Park et al.

(10) Patent No.: US 10,141,372 B2
(45) Date of Patent: Nov. 27, 2018

(54) THREE-DIMENSIONAL SEMICONDUCTOR DEVICE

(71) Applicant: SAMSUNG ELECTRONICS CO., LTD., Suwon-si, Gyeonggi-do (KR)

(72) Inventors: Joyoung Park, Seoul (KR); Seok-Won Lee, Yongin-si (KR); Seongjun Seo, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 40 days.

(21) Appl. No.: 15/067,833

(22) Filed: Mar. 11, 2016

(65) Prior Publication Data

US 2016/0293539 A1 Oct. 6, 2016

(30) Foreign Application Priority Data

Mar. 31, 2015 (KR) .................. 10-2015-0045728

(51) Int. Cl.
| | | |
|---|---|---|
| *H01L 27/24* | (2006.01) | |
| *H01L 27/11556* | (2017.01) | |
| *H01L 27/11582* | (2017.01) | |
| *H01L 27/11519* | (2017.01) | |
| *H01L 27/11548* | (2017.01) | |
| *H01L 27/11565* | (2017.01) | |
| *H01L 27/11575* | (2017.01) | |
| *H01L 27/06* | (2006.01) | |

(52) U.S. Cl.
CPC ...... *H01L 27/2481* (2013.01); *H01L 27/0688* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| | | |
|---|---|---|
| 7,679,133 B2 | 3/2010 | Son et al. |
| 8,530,350 B2 | 9/2013 | Freeman et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,697,498 B2 | 4/2014 | Jang et al. |
| 8,748,970 B1 | 6/2014 | Lee et al. |
| 8,890,229 B2 | 11/2014 | Watanabe |
| 2011/0233648 A1 | 9/2011 | Seol et al. |

(Continued)

FOREIGN PATENT DOCUMENTS

KR 1020140025798 3/2014

*Primary Examiner* — Matthew Reames
*Assistant Examiner* — Steven B Gauthier
(74) *Attorney, Agent, or Firm* — F. Chau & Associates, LLC

(57) ABSTRACT

A three-dimensional semiconductor device is provided as follows. A substrate includes a contact region, a dummy region, and a cell array region. A stack structure includes electrodes vertically stacked on the substrate. The electrodes are stacked to have a first stepwise structure on the contact region and a second stepwise structure in the dummy region. Ends of at least two adjacent electrodes in the second stepwise structure have first sidewalls vertically aligned so that horizontal positions of the first sidewalls are substantially the same.

12 Claims, 24 Drawing Sheets

(56) References Cited

U.S. PATENT DOCUMENTS

| | | |
|---|---|---|
| 2011/0266604 A1 | 11/2011 | Kim et al. |
| 2011/0316072 A1 | 12/2011 | Lee |
| 2013/0009274 A1 | 1/2013 | Lee et al. |
| 2014/0015057 A1 | 1/2014 | Lee et al. |
| 2014/0054787 A1* | 2/2014 | Eun .................. H01L 27/11548 |
| | | 257/773 |
| 2014/0070295 A1* | 3/2014 | Fukuda ............... H01L 27/0733 |
| | | 257/306 |
| 2014/0197546 A1 | 7/2014 | Hwang et al. |
| 2015/0069499 A1 | 3/2015 | Nakaki |
| 2016/0268304 A1* | 9/2016 | Ikeda ................ H01L 27/11582 |

* cited by examiner

THREE-DIMENSIONAL SEMICONDUCTOR DEVICE

CROSS-REFERENCE TO RELATED APPLICATION

This application claims priority under 35 U.S.C. § 119 to Korean Patent Application No. 10-2015-0045728, filed on Mar. 31, 2015, in the Korean Intellectual Property Office, the disclosure of which is incorporated by reference herein in its entirety.

TECHNICAL FIELD

An exemplary embodiment of the inventive concept relate to a semiconductor device, and in particular, to a highly integrated three-dimensional semiconductor device.

DISCUSSION OF RELATED ARTS

Consumers demand semiconductor devices highly integrated at lower costs. Three-dimensional (3D) semiconductor devices including three-dimensionally-arranged memory cells have been proposed to satisfy those consumer demands.

SUMMARY

According to an exemplary embodiment of the present inventive concept, a three-dimensional semiconductor device is provided as follows. A substrate includes a contact region, a dummy region, and a cell array region. A stack structure includes electrodes vertically stacked on the substrate. The electrodes are stacked to have a first stepwise structure on the contact region and a second stepwise structure in the dummy region. Ends of at least two adjacent electrodes in the second stepwise structure have first sidewalls vertically aligned so that horizontal positions of the first sidewalls are substantially the same.

According to an exemplary embodiment of the present inventive concept, a three-dimensional semiconductor device is provided as follows. A substrate includes first and second contact regions opposite to each other in a first direction, first and second dummy regions opposite to each other in a second direction substantially perpendicular to the first direction, and a cell array region disposed between the first and second contact regions and between the first and second dummy regions. A stack structure includes electrodes vertically stacked on the substrate. A horizontal length, measured along the first direction, of the first contact region is greater than a horizontal length, measured along the second direction, of the first dummy region.

According to an exemplary embodiment of the present inventive concept, a three-dimensional semiconductor device is provided as follows. A substrate includes a cell array region and first to fourth regions surrounding the cell array region. A stack structure includes electrodes vertically stacked on the cell array region and the first to fourth regions. At least two adjacent regions of the first to fourth regions have different widths from each other.

According to an exemplary embodiment of the present inventive concept, a semiconductor device is provided as follows. Electrodes and insulating layers are disposed on a substrate, each electrode and each insulating layer being alternately stacked so that the electrodes and the insulating layers are stacked in a pyramid-shaped structure. Each side surface of the pyramid-shaped structure has a stepped surface sloped in a predetermined angle with respect to a top surface of the substrate. Vertical structures are disposed within an uppermost electrode and penetrates the electrodes and the insulating layers to be in contact with the substrate. Contact plugs are disposed on a first side surface of the pyramid-shaped structure. The first side surface has the largest predetermined angle and each contact plug is connected to a corresponding portion of the electrodes within the first side surface.

BRIEF DESCRIPTION OF DRAWINGS

These and other features of the inventive concept will become more apparent by describing in detail exemplary embodiments thereof with reference to the accompanying drawings of which.

Figure 1:
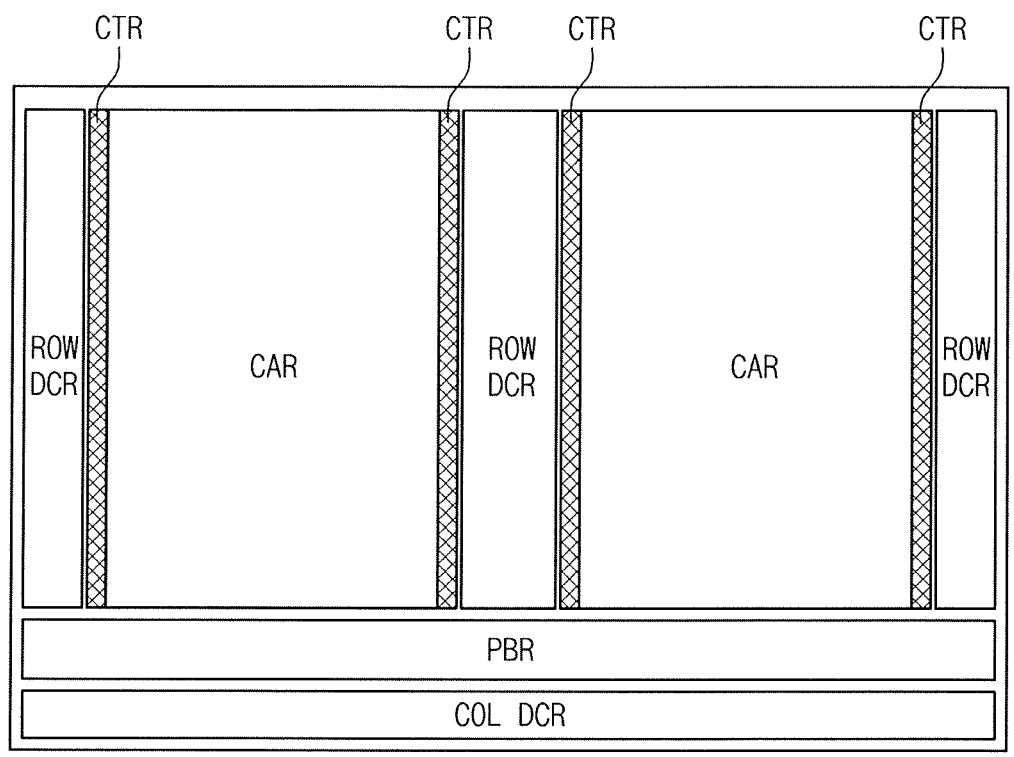
FIG. 1 is a layout of a three-dimensional semiconductor memory device according to an exemplary embodiment of the inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTIONS OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

An exemplary embodiment of the inventive concepts are described herein with reference to cross-sectional illustrations that are schematic illustrations of idealized embodiments (and intermediate structures) of an exemplary embodiment. As such, variations from the shapes of the illustrations as a result, for example, of manufacturing techniques and/or tolerances, are to be expected. Thus, an exemplary embodiment of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of an exemplary embodiment.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 2:
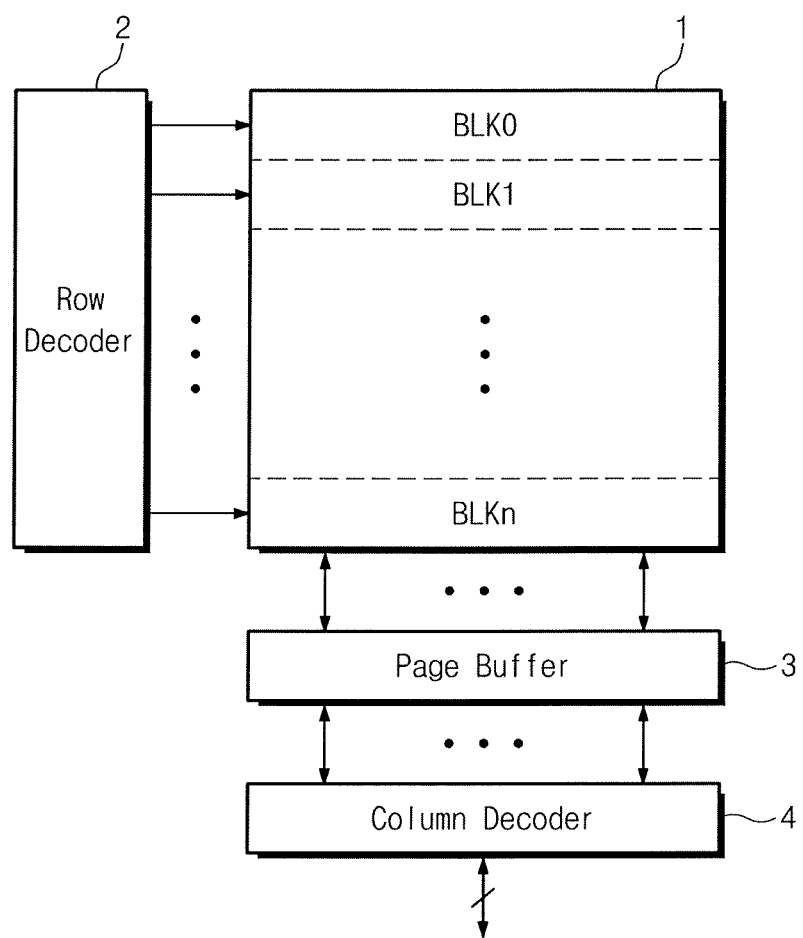
FIG. 2 is a block diagram illustrating a three-dimensional semiconductor memory device according to an exemplary embodiment of the inventive concept.

FIG. 1 is a layout of a three-dimensional semiconductor memory device according to an exemplary embodiment of the inventive concept. FIG. 2 is a block diagram illustrating a three-dimensional semiconductor memory device according to an exemplary embodiment of the inventive concept.

Referring to FIG. 1, a three-dimensional semiconductor memory device may include a cell array region CAR and a peripheral circuit region. The peripheral circuit region may include at least one row decoder region ROW DCR, at least one page buffer region PBR, and at least one column decoder region COL DCR. Furthermore, a contact region CTR may be provided between the cell array region CAR and each row decoder region ROW DCR.

Referring to FIGS. 1 and 2, a memory cell array 1 including a plurality of memory cells may be provided on the cell array region CAR. The memory cell array 1 may further include word and bit lines electrically connected to the memory cells, in addition to the memory cells. In an exemplary embodiment, the memory cell array 1 may include a plurality of memory blocks BLK0-BLKn, each of which is configured to independently perform an erase operation. The memory cell array 1 will be described in more detail with reference to FIGS. 3 and 4.

In each row decoder region ROW DCR, a row decoder 2 may be provided to allow for selection of the word lines in the memory cell array 1. In each contact region CTR, an interconnection structure may be provided to connect the memory cell array 1 to the row decoder 2. The row decoder 2 may be configured to select a specific memory block from the memory blocks BLK0-BLKn of the memory cell array 1 and moreover a specific word line from the word lines of the selected memory block, depending on address information to be input. In addition, the row decoder 2 may be configured to provide word-line voltages, which are generated in a voltage generator (not shown), adaptively to the selected word line and un-selected word lines, in response to control signals from a control circuit (not shown).

In each page buffer region PBR, at least one page buffer 3 may be provided to read out data stored in the memory cells. Depending on an operation mode, each page buffer 3 may execute a process of temporarily storing data to be stored in the memory cells or of reading out data stored in the memory cells. For example, the page buffer 3 may function as a write driver in a program operation mode or as a sense amplifier in a read operation mode.

A column decoder 4 connected to the bit lines of the memory cell array 1 may be provided in each column decoder region COL DCR. The column decoder 4 may be configured to provide data-transmission paths between the page buffer 3 and an external device (e.g., a memory controller).

Figure 3:
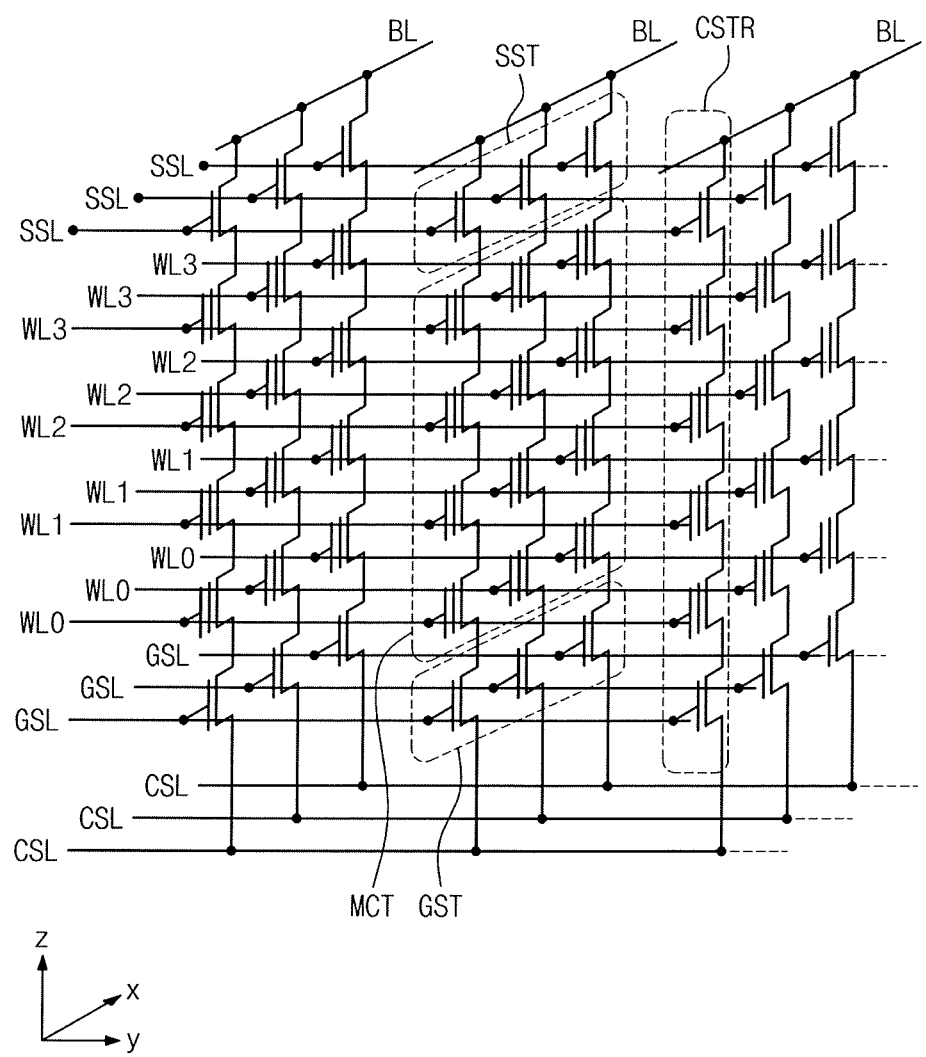
FIG. 3 is a circuit diagram illustrating a memory cell array of a three-dimensional semiconductor memory device according to an exemplary embodiment of the inventive concept.

FIG. 3 is a schematic circuit diagram illustrating a memory cell array of a three-dimensional semiconductor memory device according to an exemplary embodiment of the inventive concept.

Referring to FIG. 3, a three-dimensional semiconductor memory device may include a memory cell array, in which a common source line CSL, a plurality of bit lines BL, and a plurality of cell strings CSTR are provided.

The bit lines BL may be two-dimensionally arranged and a plurality of cell strings CSTR may be connected in parallel to each of the bit lines BL. The cell strings CSTR may be connected in common to the common source line CSL. For example, the plurality of cell strings CSTR may be provided between the plurality of bit lines BL and the common source line CSL. In an exemplary embodiment, a plurality of common source lines CSL may be two-dimensionally arranged on the substrate. In an exemplary embodiment, the common source lines CSL may be applied with the same voltage. In an exemplary embodiment, the common source lines CSL may be separated from each other and may be independently controlled.

Each of the cell strings CSTR may include a ground selection transistor GST connected to the common source line CSL, a string selection transistor SST connected to one of the bit lines BL, and a plurality of memory cell transistors MCT provided between the ground and string selection transistors GST and SST. In addition, the memory cell transistors MCT may be connected in series to the ground selection transistor GST and the string selection transistor SST.

The common source line CSL may be connected in common to sources of the ground selection transistors GST of the cell strings CSTR. In addition, at least one ground selection line GSL, a plurality of word lines WL0 to WL3, and a plurality of string selection lines SSL may be disposed between the common source line CSL and the bit lines BL to serve as gate electrodes of the ground selection transistor GST, the memory cell transistors MCT, and the string selection transistors SST, respectively. Each of the memory cell transistors MCT may include a data storage element.

Figure 4:
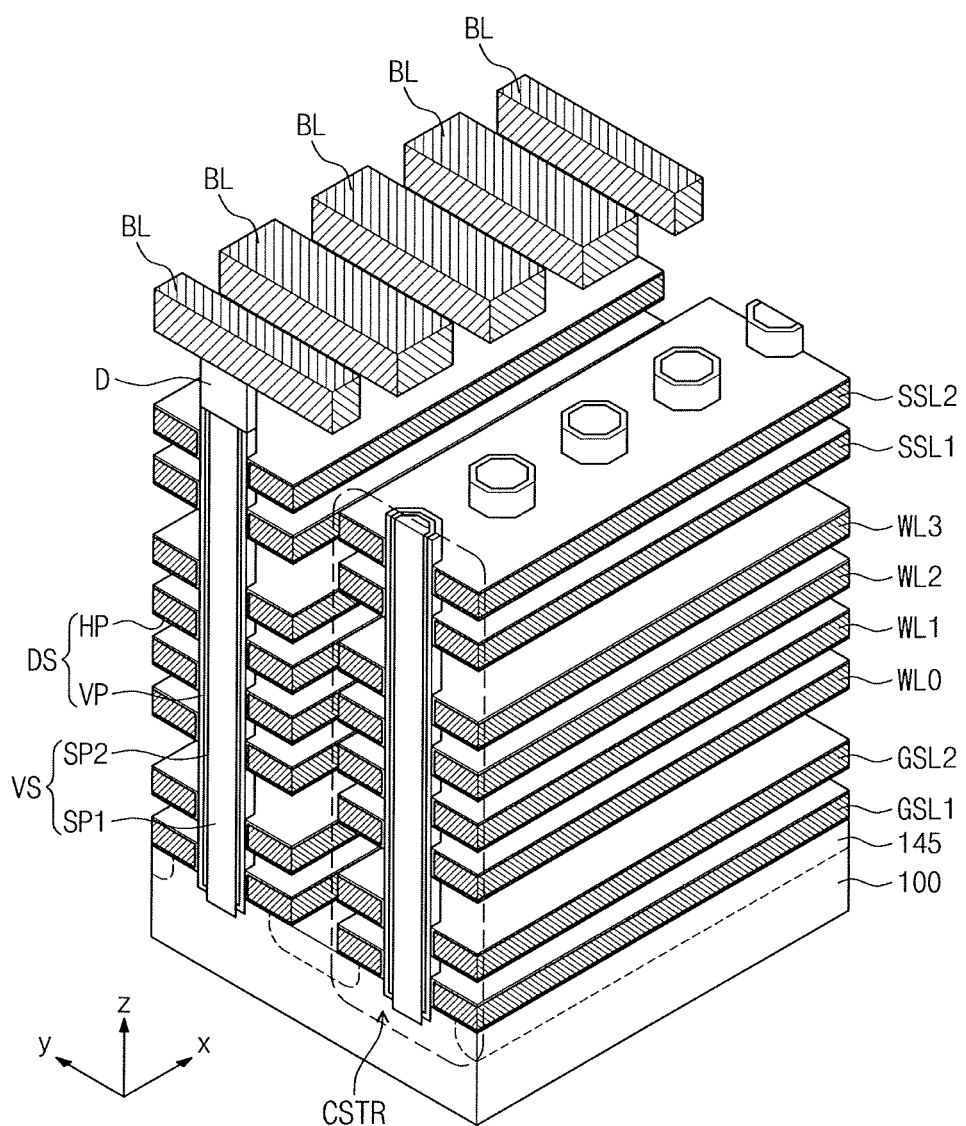
FIG. 4 is a perspective view illustrating a memory cell array of a three-dimensional semiconductor memory device according to an exemplary embodiment of the inventive concept.

FIG. 4 is a perspective view illustrating a memory cell array of a three-dimensional semiconductor memory device according to an exemplary embodiment of the inventive concept.

Referring to FIG. 4, the common source line CSL (not shown here) may be a conductive layer disposed on a substrate 100 or an impurity region 145 formed in the substrate 100. The bit lines BL may be conductive patterns (e.g., metal lines) that are vertically spaced apart from the substrate 100. The bit lines BL may be two-dimensionally arranged and a plurality of cell strings CSTR may be connected in parallel to each of the bit lines BL. Accordingly, the cell strings CSTR may be two-dimensionally arranged on the common source line CSL or the substrate 100.

Each of the cell strings CSTR may include a plurality of ground selection lines GSL1 and GSL2, a plurality of word lines WL0-WL3, and a plurality of string selection lines SSL1 and SSL2, which are disposed between the common source line CSL and the bit lines BL. In an exemplary embodiment, the string selection lines SSL1 and SSL2 may serve as the string selection line SSL of FIG. 3, and the ground selection lines GSL1 and GSL2 may serve as the ground selection line GSL of FIG. 3. The ground selection lines GSL1 and GSL2, the word lines WL0-WL3, and the string selection lines SSL1 and SSL2 may be conductive patterns (i.e., gate electrodes) that are stacked on each other from the substrate 100.

In addition, each of the cell strings CSTR may include a vertical structure VS vertically extending from the common source line CSL, and the vertical structure VS may be connected to the bit line BL. The vertical structure VS may be formed to penetrate the ground selection lines GSL1 and GSL2, the word lines WL0-WL3, and the string selection lines SSL1 and SSL2. For example, the vertical structures VS may penetrate a plurality of conductive patterns stacked on the substrate 100.

In an exemplary embodiment, the vertical structure VS may be formed of or include a semiconductor material and may include a first semiconductor pattern SP1, which is connected to the substrate 100, and a second semiconductor pattern SP2, which is interposed between the first semiconductor pattern SP1 and a data storing layer DS. Furthermore, the vertical structures VS may include impurity regions D. The drain region D may be formed in a top portion of the vertical structure VS.

The data storing layer DS may be disposed between the word lines WL0-WL3 and the vertical structures VS. In an exemplary embodiment, the data storing layer DS may be a charge storing layer. For example, the data storing layer DS may be or include at least one of a trap insulating layer, a floating gate electrode, and an insulating layer with conductive nano-dots. Data stored in the data storing layer DS may be changed using a Fowler-Nordheim FN tunneling effect, which may be caused by a voltage difference between the vertical structure VS and the word lines WL0-WL3. In an exemplary embodiment, the data storing layer DS may include a phase-changeable or variable resistance property layer, which is configured to store data therein, for example.

In an exemplary embodiment, the data storing layer DS may include a vertical pattern VP, which is provided to penetrate the word lines WL0-WL3, and a horizontal pattern HP, which is disposed between the word lines WL0-WL3 and the vertical pattern VP to cover top and bottom surfaces of the word lines WL0-WL3.

A dielectric layer serving as a gate insulating layer of a transistor may be provided between the ground selection lines GSL1 and GSL2 and the vertical structures VS or between the string selection lines SSL1 and SSL2 and the vertical structure VS. Here, the dielectric layer may be formed of the same material as the data storing layer DS and, in an exemplary embodiment, it may be formed of the same material (e.g., silicon oxide) as a gate insulating layer of a metal-oxide-semiconductor field-effect transistor (MOSFET).

In this structure, the vertical structures VS, in conjunction with the ground selection lines GSL1 and GSL2, the word lines WL0-WL3, and the string selection lines SSL1 and SSL2, may constitute a metal-oxide-semiconductor field effect transistor (MOSFET) using the vertical structure VS as a channel region.

In this case, the ground selection lines GSL1 and GSL2, the word lines WL0-WL3, and the string selection lines SSL1 and SSL2 may serve as gate electrodes of the selection transistors and the cell transistors. In this case, according to voltages applied to the word lines WL0-WL3 and the selection lines SSL1, SSL2, GSL1, and GSL2, inversion regions may be formed in the vertical structures VS, by fringe field produced near the word lines WL0-WL3 and the selection lines SSL1, SSL2, GSL1, and GSL2. Here, the word lines WL0-WL3 or the selection lines SSL1, SSL2, GSL1, and GSL2 may be formed to have a smaller thickness than a maximum length or width of the inversion region. Accordingly, in each of the vertical structures VS, the inversion regions may be vertically overlapped with each other to form a current path electrically connecting the common source line CSL and a selected one of the bit lines BL. For example, the ground and string selection transistors controlled by the ground and string selection lines GSL1, GSL2, SSL1, and SSL2 and the cell transistors MCT controlled by the word lines WL0-WL3 may be connected in series, in the cell string CSTR.

In an exemplary embodiment, the vertical structures VS, in conjunction with the ground selection lines GSL1 and GSL2, the word lines WL0-WL3, and the string selection lines SSL1 and SSL2, may constitute a metal-oxide-semiconductor (MOS) capacitor.

Figure 5A:
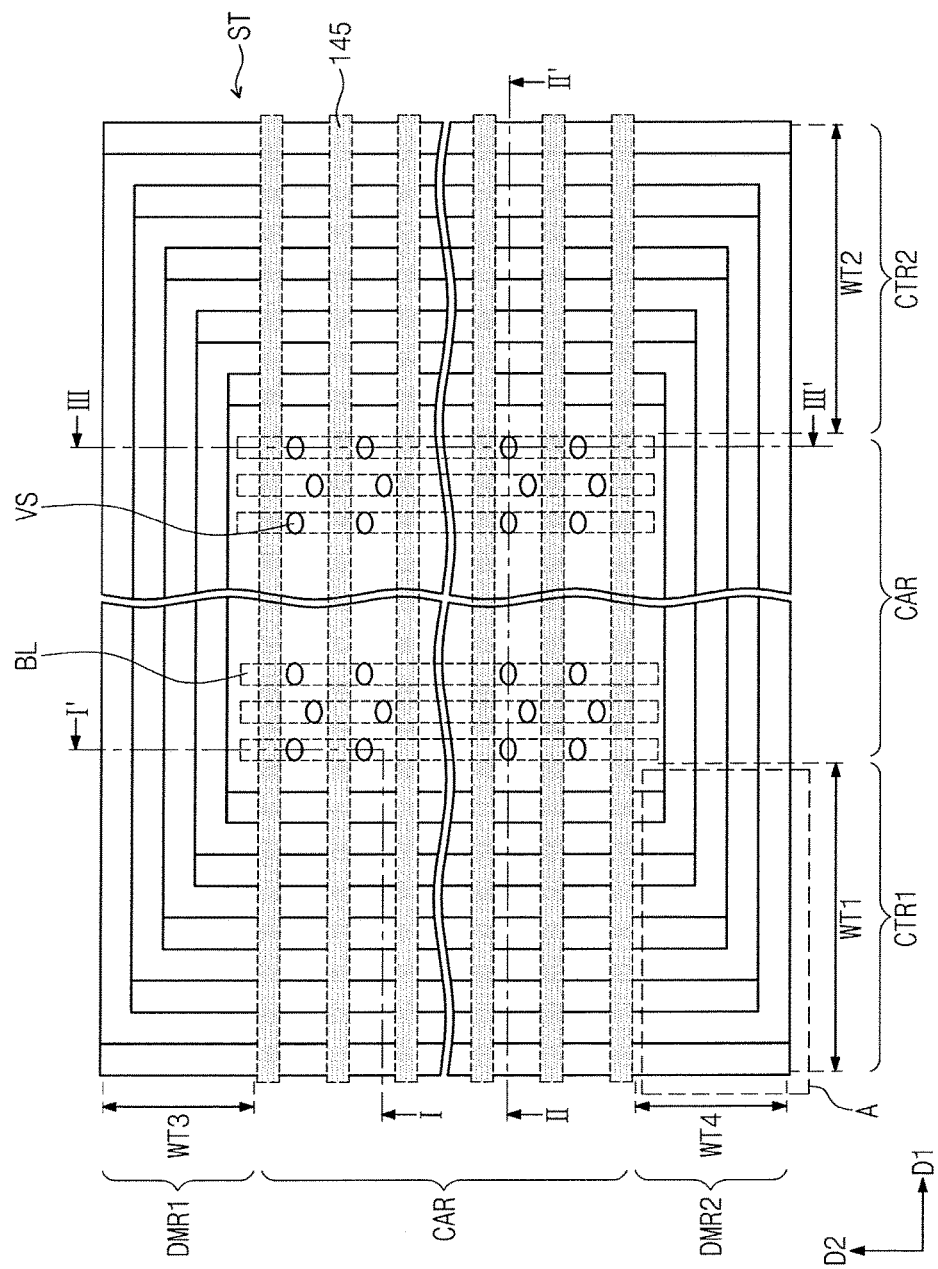
FIG. 5A is a plan view illustrating a memory cell region of a three-dimensional semiconductor memory device according to an exemplary embodiment of the inventive concept.
Figure 5B:
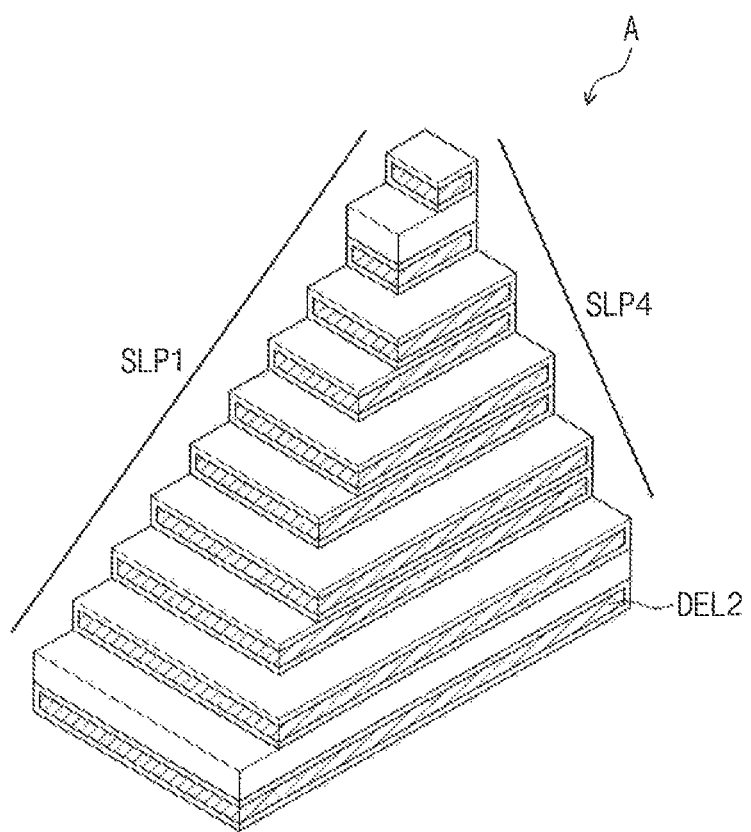
FIG. 5B is an enlarged perspective view illustrating a portion 'A' of FIG. 5A.
Figure 6A:
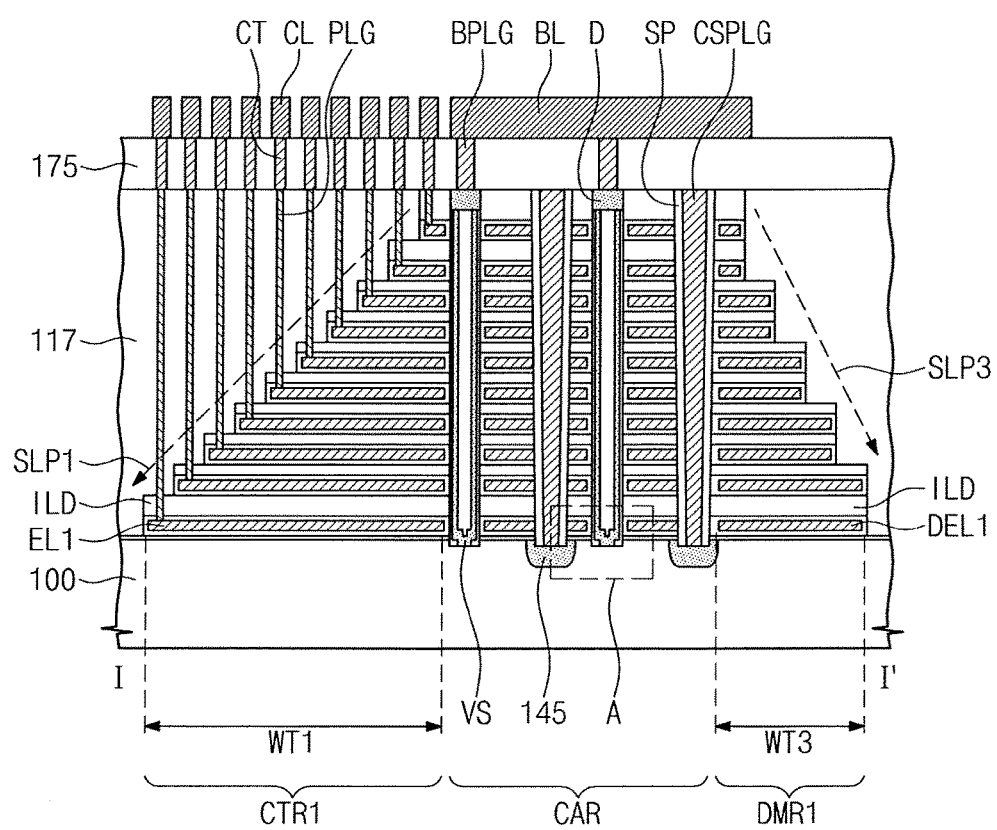
FIG. 6A is a sectional view, taken along line I-I', of the three-dimensional semiconductor memory device of FIG. 5A.
Figure 6B:
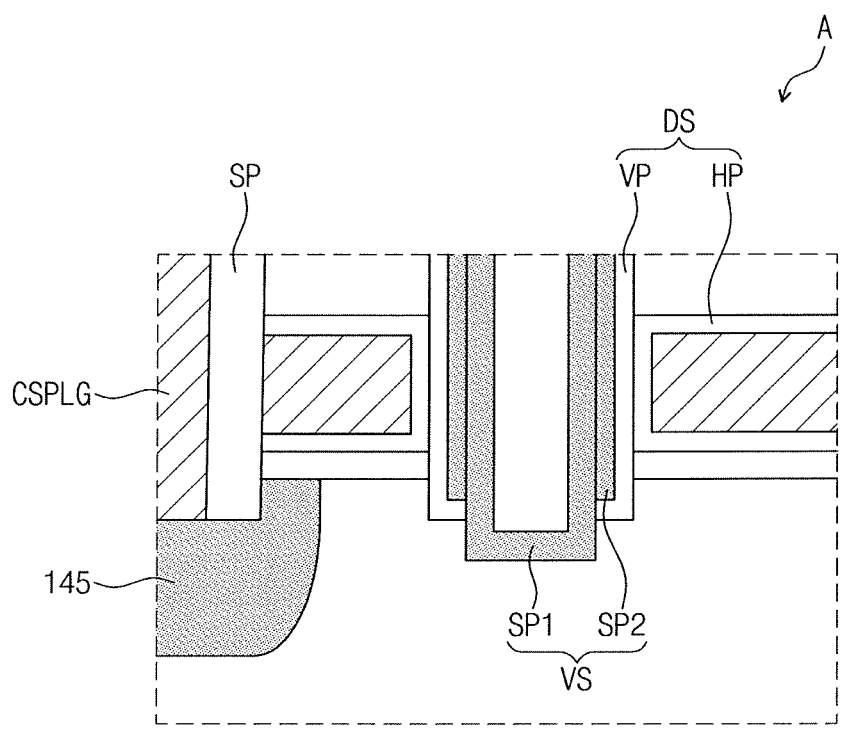
FIG. 6B is an enlarged sectional view illustrating a portion 'A' of FIG. 6A.
Figure 7:
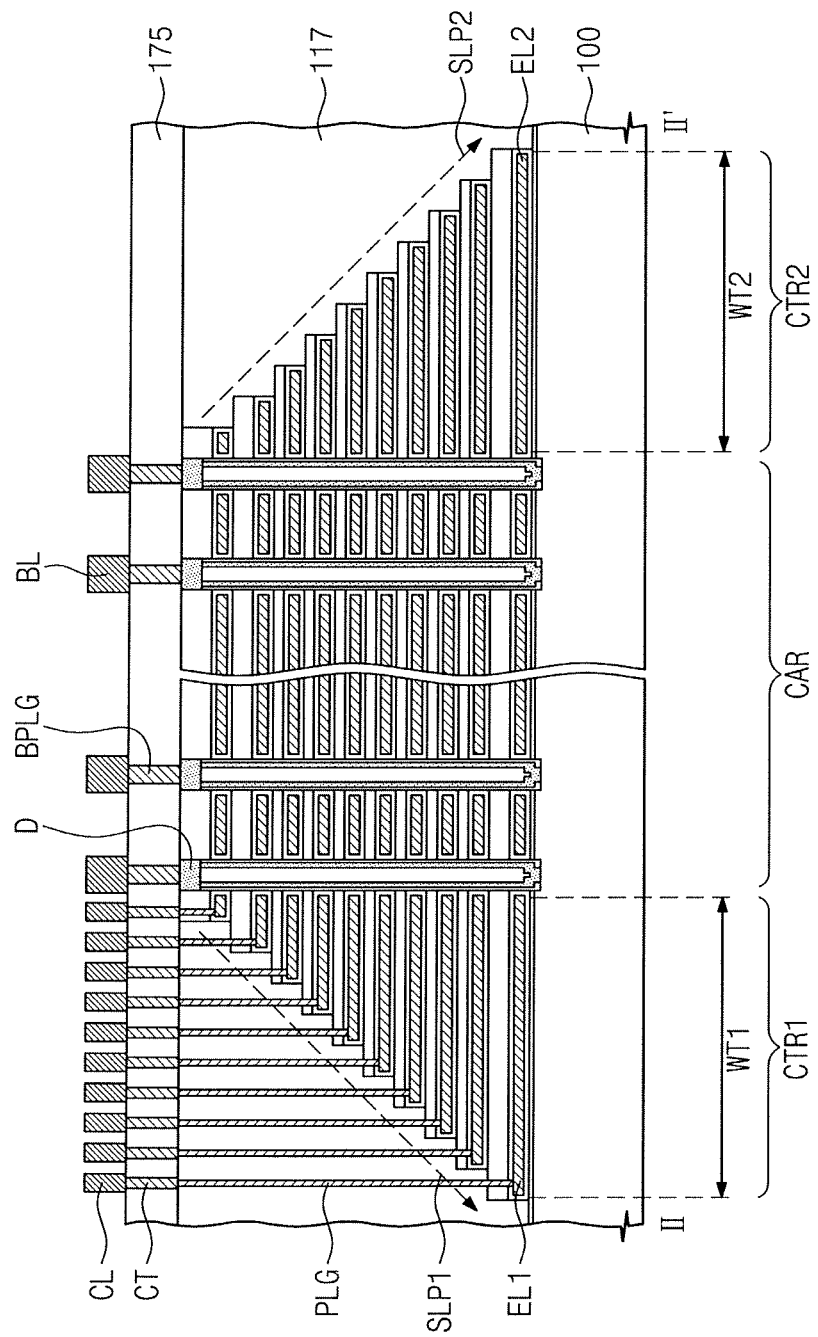
FIG. 7 is a sectional view, taken along line II-II', of the three-dimensional semiconductor memory device of FIG. 5A.
Figure 8:
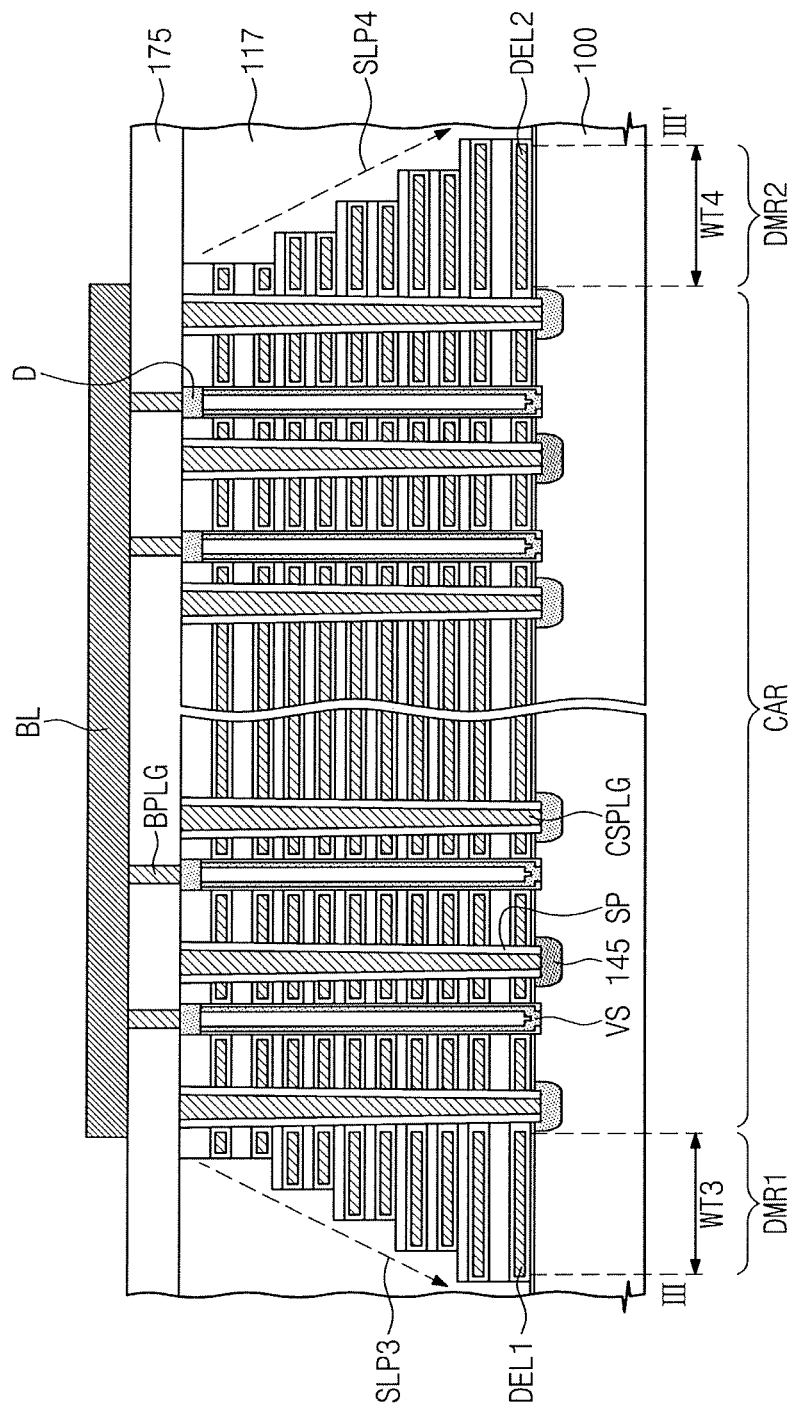
FIG. 8 is a sectional view, taken along line III-III', of the three-dimensional semiconductor memory device of FIG. 5A.

FIG. 5A is a plan view illustrating a memory cell region of a three-dimensional semiconductor memory device according to an exemplary embodiment of the inventive concept, and FIG. 5B is an enlarged perspective view illustrating a portion 'A' of FIG. 5A. FIG. 6A is a sectional view, taken along line I-I', of the three-dimensional semiconductor memory device of FIG. 5A, and FIG. 6B is an enlarged sectional view illustrating a portion 'A' of FIG. 6A. FIG. 7 is a sectional view, taken along line II-II', of the three-dimensional semiconductor memory device of FIG. 5A, and FIG. 8 is a sectional view, taken along line III-III', of the three-dimensional semiconductor memory device of FIG. 5A.

Referring to FIGS. 5A, 5B, 6A, 6B, 7, and 8, the substrate 100 may include the cell array region CAR, first and second contact regions CTR1 and CTR2, which are positioned at both sides of the cell array region CAR in a first direction D1, and first and second dummy regions DMR1 and DMR2, which are positioned at both sides of the cell array region CAR in a second direction D2 perpendicular to the first direction D1.

A cell array structure including stack structures ST and vertical structures VS, common source regions 145, common source structures, interconnection structures, and bit lines BL may be provided on the substrate 100.

Each of the stack structures ST may include electrodes EL and insulating layers ILD, which are alternatingly and sequentially stacked on the substrate 100. The electrodes EL of the stack structures ST may include a conductive material—for example, the electrodes EL may include doped semiconductor (e.g., doped silicon), metals (e.g., tungsten, copper, aluminum, and so forth), conductive metal nitrides (e.g., titanium nitride, tantalum nitride, and so forth), or transition metals (e.g., titanium, tantalum, and so forth). In the stack structures ST, the insulating layers ILD may include at least one insulating layer thinner than the other insulating layers. For example, the lowermost one of the insulating layers ILD may be thinner than the others. In an exemplary embodiment, at least one of the insulating layers ILD may be formed thicker than the others. The insulating layers ILD may be formed of or include silicon oxide.

The stack structures ST may be formed to have a stepwise structure on at least one of the first and second contact regions CTR1 and CTR2 to electrically connect the electrodes EL to peripheral circuits. The electrodes EL will be described in more detail below.

The insulating gapfill layer 117 may be formed on the substrate 100 to cover the stack structures ST. The capping insulating layer 175 may cover a plurality of stack structures ST and the insulating gapfill layer 117. The bit lines BL may be disposed on the capping insulating layer 175 to cross the stack structures ST and extend in the second direction D2. The bit lines BL may be electrically connected to the vertical structures VS via bit line contact plugs BPLG.

The vertical structures VS may be provided to penetrate the stack structures ST and may be electrically connected to the substrate 100. In an exemplary embodiment, the vertical structures VS may be disposed to form a zigzag arrangement, when viewed in a plan view or when viewed from the above the device. In an exemplary embodiment, the vertical structures VS may be disposed to form a linear arrangement, when viewed in a plan view.

In an exemplary embodiment, the vertical structures VS may include a semiconductor material. For example, as shown in FIG. 6B, the vertical structure VS may include the first semiconductor pattern SP1, which is connected to the substrate 100, and the second semiconductor pattern SP2, which is interposed between the first semiconductor pattern SP1 and the data storing layer DS. The first semiconductor pattern SP1 may be shaped like a hollow pipe (or macaroni) having one closed end. In an exemplary embodiment, the first semiconductor pattern SP1 may be shaped like a circular pillar. In an exemplary embodiment, the first semiconductor pattern SP1 may be shaped liked a hollow pipe or macaroni. The first semiconductor pattern SP1 may have a closed bottom, and an inner space of the first semiconductor pattern SP1 may be filled with an insulating material.

The data storing layer DS may be disposed between the stack structures ST and the vertical structures VS. The data storing layer DS may include the vertical pattern VP, which is provided to penetrate the stack structures ST, and the horizontal pattern HP, which is provided between the electrodes EL and the vertical patterns VP and is extended to cover top and bottom surfaces of the electrodes EL.

The interconnection structure may be provided on at least one of the first and second contact regions CTR1 and CTR2 to electrically connect the cell array structure to the peripheral circuits. In an exemplary embodiment, the interconnection structure may include contact plugs PLG, which are provided on at least one of the first or second contact regions CTR1 and CTR2 and are respectively connected to end portions of the electrodes EL through the insulating gapfill layer 117, and connection lines CL, which are provided on the insulating gapfill layer 117 and are connected to the contact plugs PLG through contact patterns CT. A vertical length of the contact plugs PLG may increase in a direction toward the substrate 100. The contact plugs PLG may have top surfaces that are substantially coplanar with those of the vertical structures VS.

The common source regions 145 may be formed in the substrate 100 and between the stack structures ST. The common source regions 145 may extend parallel to the first direction D1. The stack structures ST and the common source regions 145 may be alternatingly and repeatedly arranged in the second direction D2.

Each of the common source structures may be provided between the stack structures ST and may be electrically connected to a corresponding one of the common source regions 145. The common source structure may include an insulating sidewall spacer SP covering sidewalls of the stack structures ST and a common source plug CSPLG, which is connected to the common source region 145. In read and program operations of the three-dimensional semiconductor memory device, a ground voltage may be applied to the common source region 145 through the common source plug CSPLG. In an exemplary embodiment, the common source plug CSPLG may have a substantially uniform upper width and may extend parallel to the first direction D1. In an exemplary embodiment, a pair of the insulating sidewall spacers SP facing each other may be provided between an adjacent pair of the stack structures ST. In an exemplary embodiment, the insulating sidewall spacer SP may be provided to fill a gap region between an adjacent pair of the stack structures ST, and the common source plug CSPLG may be provided to penetrate the insulating sidewall spacer SP and be in partial contact with the common source region 145. The insulating sidewall spacer SP may be formed of or include silicon oxide, silicon nitride, silicon oxynitride, or low-k dielectric materials. The common source plug CSPLG may include metals (e.g., tungsten, copper or aluminum), conductive metal nitrides (e.g., titanium nitride, or tantalum nitride), or transition metals (e.g., titanium or tantalum).

Hereinafter, the electrodes will be described in more detail.

Referring to FIGS. 5A, 5B, 6A, 7, and 8, the electrodes may be provided to cover the cell array region CAR, the first and second contact regions CTR1 and CTR2, and the first and second dummy regions DMR1 and DMR2.

For the sake of brevity, electrodes provided on the first and second contact regions CTR1 and CTR2 will be referred to as 'first and second electrodes EL1 and EL2' in FIG. 7, respectively, and electrodes provided on the first and second dummy regions DMR1 and DMR2 will be referred to as 'first and second dummy electrodes DEL1 and DEL2', respectively, in FIG. 8. Furthermore, although ten electrodes are illustrated in FIGS. 5A, 5B, 6A, 7, and 8, the number of the electrodes may be variously changed.

Each of the first electrodes EL1 may have first ends of which horizontal positions are different from each other. The lower the first electrode EL1 is positioned in a stepwise structure of the first electrodes EL1, the farther the first end of the first electrode EL1 is positioned from a center of the cell array region CAR. For example, the horizontal length of the first electrode EL1 may increase in a stepwise manner with decreasing distance from the substrate 100. For example, the first electrodes EL1 may be stacked to form a stepwise structure with ten steps. The first ends of the first electrodes EL1 may be positioned in a first slope SLP1 in the first contact region CRT 1 with respect to the top surface of the substrate 100.

The first contact region CTR1 may be provided to have a first width WT1. The first width WT1 of the first contact region CTR1 may be substantially equal to the longest of horizontal lengths of the first electrodes EL1, when measured in the first direction D1.

The second electrodes EL2 may have second ends of which horizontal positions are different from each other. The lower the second electrode EL2 may be positioned in a stepwise structure of the second electrodes EL2, the farther the second end of the second electrode EL2 is positioned from the center of the cell array region CAR. For example, the horizontal length of the second electrode EL2 may increase in a stepwise manner with decreasing distance from the substrate 100. For example, the second electrodes EL2 may be stacked to form a stepwise structure with ten steps. The second ends of the second electrodes EL2 may be positioned in a second slope SLP2 in the second contact region CFR2 with respect to the top surface of the substrate 100.

The second contact region CTR2 may be provided to have a second width WT2. The second width WT2 of the second contact region CTR2 may be substantially equal to the longest of horizontal lengths of the second electrodes EL2, when measured in the first direction D1. In an exemplary embodiment, the first width WT1 of the first contact region CTR1 may be substantially equal to the second width WT2 of the second contact region CTR2.

In an exemplary embodiment, the first and second electrodes EL1 and EL2 positioned at the same level may have substantially the same horizontal length. For example, the lowermost one of the first electrodes EL1 and the lowermost one of the second electrodes EL2, in a vertical direction, may have substantially the same horizontal length (e.g., a first length). As shown in FIGS. 6A, 7, and 8, a corresponding pair of the first and second electrodes EL1 and EL2 may be symmetrically disposed with respect to the cell array region CAR. In this case, the first and second slopes SLP1 and SLP2 may be substantially the same.

The first dummy electrodes DEL1 may have third ends, respectively. At least two of the third ends may have the same horizontal position. The first dummy electrodes DEL1 whose third ends have the same horizontal position, may be disposed adjacent to each other. For example, the lowermost first dummy electrode and the adjacent first dummy electrode may have third ends having the same horizontal position. The lower the first dummy electrode DEL1 is positioned in a stepwise structure of the first dummy electrodes DEL1, the farther the third end of the first dummy electrode DEL1 is positioned from the center of the cell array region CAR. The third ends of the first dummy electrodes may be positioned in a third slope SLP3 in the first dummy region DMR1 with respect to the top surface of the substrate 100. The third slope SLP3 may be greater than the first slope SLP1.

For example, as shown in FIGS. 5A and 8, in the stack structure of the first dummy electrodes DEL1, ones at first and second levels may have vertically-aligned ends, and ones at third and fourth levels may have vertically-aligned ends and may have a horizontal length shorter than the ones at the first and second levels. The first dummy electrodes DEL1 may be stacked to form a stepwise structure with five steps. For example, two adjacent first dummy electrodes DEL1 may form one step of the stepwise structure. In the case of the five steps, the stepwise structure may include ten (10) first dummy electrodes DEL1 stacked on each other.

The second dummy electrodes DEL2 may have fourth ends, respectively. At least two of the fourth ends may have the same horizontal position. The second dummy electrodes DEL2 of which fourth ends have the same horizontal position, may be disposed adjacent to each other. The lower the second dummy electrode DEL2 is positioned in a stepwise structure of the second dummy electrodes DEL2, the farther the fourth end of the second dummy electrode DEL2 is positioned from the center of the cell array region CAR. The fourth ends of the second dummy electrode DEL2 may be positioned in a fourth slope SLP4 in the second dummy region DMR2 with respect to the top surface of the substrate 100. The fourth slope SLP4 may be greater than the first slope SLP1.

For example, as shown in FIGS. 5A and 8, in the stack structure of the second dummy electrodes DEL2, ones at first and second levels may have vertically-aligned ends, and ones at third and fourth levels may have vertically-aligned ends and may have a horizontal length shorter than the ones at the first and second levels. The second dummy electrodes DEL2 may be stacked to form a stepwise structure with five steps. For example, two adjacent second dummy electrodes DEL2 may form one step of the stepwise structure. In the case of the five steps, the stepwise structure may include ten (10) second dummy electrodes DEL2 stacked on each other.

In an exemplary embodiment, the first and second dummy electrodes DEL1 and DEL2 positioned at the same level may have substantially the same horizontal length. For example, the lowermost first dummy electrodes DEL1 and the lowermost second dummy electrodes DEL2, in the vertical direction, may have substantially the same horizontal length (e.g., a first length). As shown in FIGS. 6A, 7, and 8, a corresponding pair of the first and second dummy electrodes DEL1 and DEL2 may be symmetrically disposed with respect to the cell array region CAR. In this case, the third and fourth slopes SLP3 and SLP4 may be substantially the same.

In an exemplary embodiment, the contact plugs PLG of the interconnection structure may be respectively connected to the first electrodes EL1 of the first contact region CTR1. Although not shown, depending on configuration of the interconnection structure, the second electrodes EL2 of the second contact region CTR2 may also be electrically connected to the interconnection structure. However, at least two of the first and second dummy electrodes DEL1 and DEL2 may be stacked in a vertically aligned manner on the first and second dummy regions DMR1 and DMR2. The interconnection structure need not be formed in the first and second dummy regions DMR1 and DMR2 to reduce the area of the first and second dummy regions DMR1 and DMR2, and to increase the effective area of the cell array region CAR. In an exemplary embodiment, the effective area of the cell array region CAR may increase as the area reduced by the first and second dummy regions DMR1 and DMR2 according to an exemplary embodiment.

Referring to FIGS. 5A and 6A, the three-dimensional semiconductor device may include a pyramid-shaped structure including the electrodes EL and the insulating layers ILD. Each electrode EL and each insulating layer ILD may be alternately stacked so that the electrodes EL and the insulating layers ILD are stacked in the pyramid-shaped structure. Each side surface of the pyramid-shaped structure has a stepped surface sloped in a predetermined angle with respect to a top surface of the substrate 100. Vertical structures VS may be disposed within an uppermost electrode and may penetrate the electrodes EL and the insulating layers ILD to be in contact with the substrate 100. The contact plugs PLG may be disposed on a first side surface of the pyramid-shaped structure having the slope of SLP1. The first side surface has the largest predetermined angle and each contact plug PLG is connected to a corresponding portion of the electrodes EL within the first side surface.

Figure 9A:
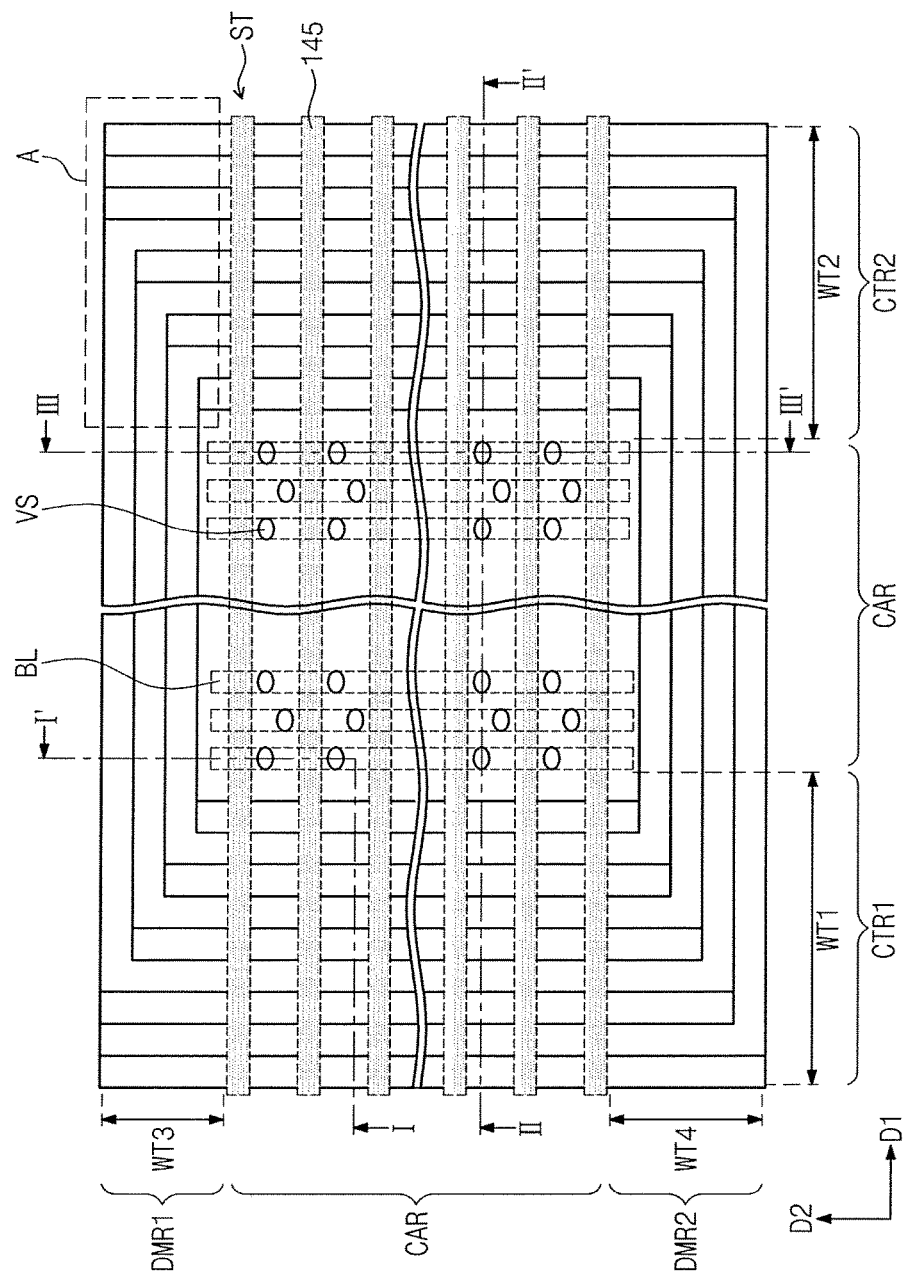
FIG. 9A is a plan view illustrating a memory cell region of a three-dimensional semiconductor memory device according to other an exemplary embodiment of the inventive concept.
Figure 9B:
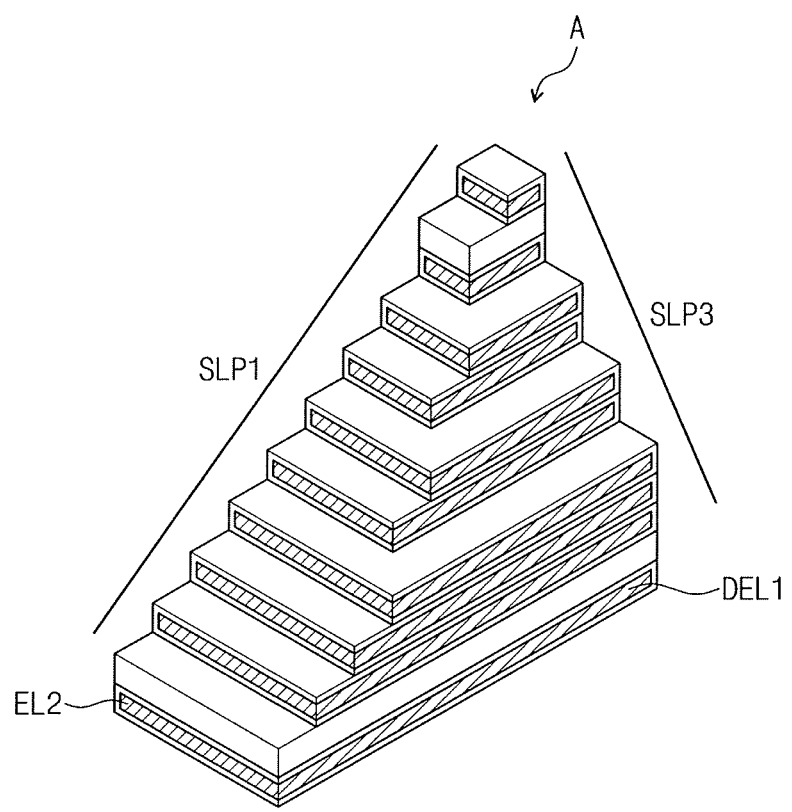
FIG. 9B is an enlarged perspective view illustrating a portion 'A' of FIG. 9A.
Figure 10:
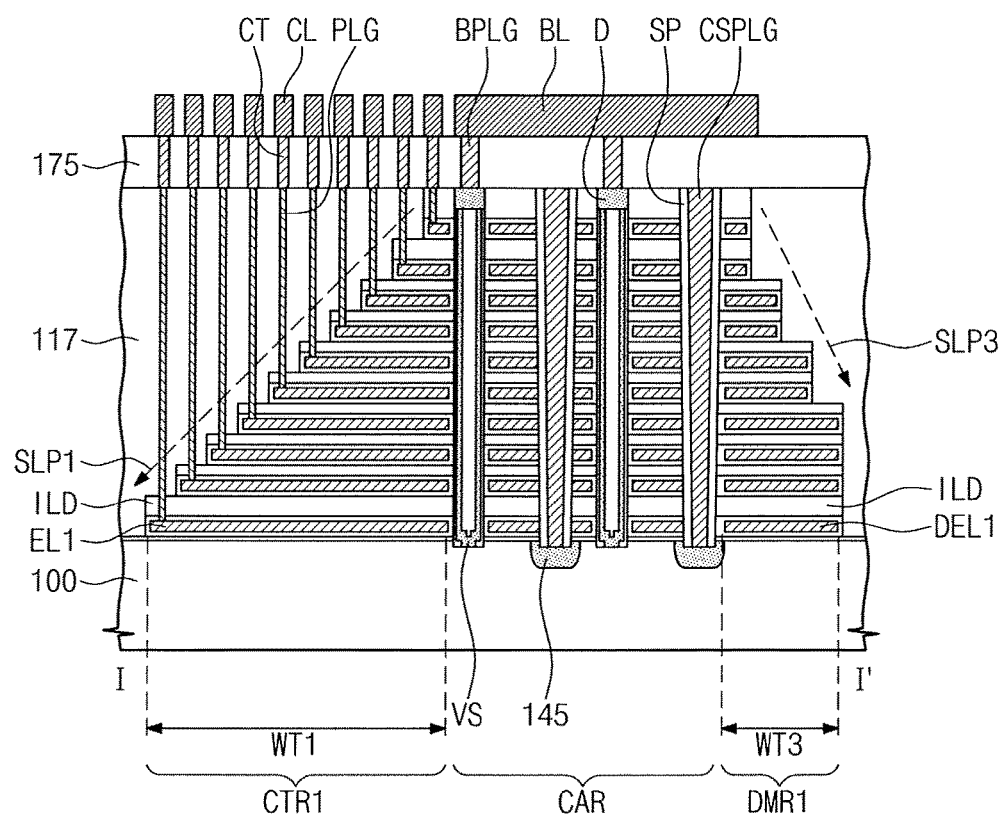
FIG. 10 is a sectional view, taken along line I-I', of the three-dimensional semiconductor memory device of FIG. 9A.
Figure 11:
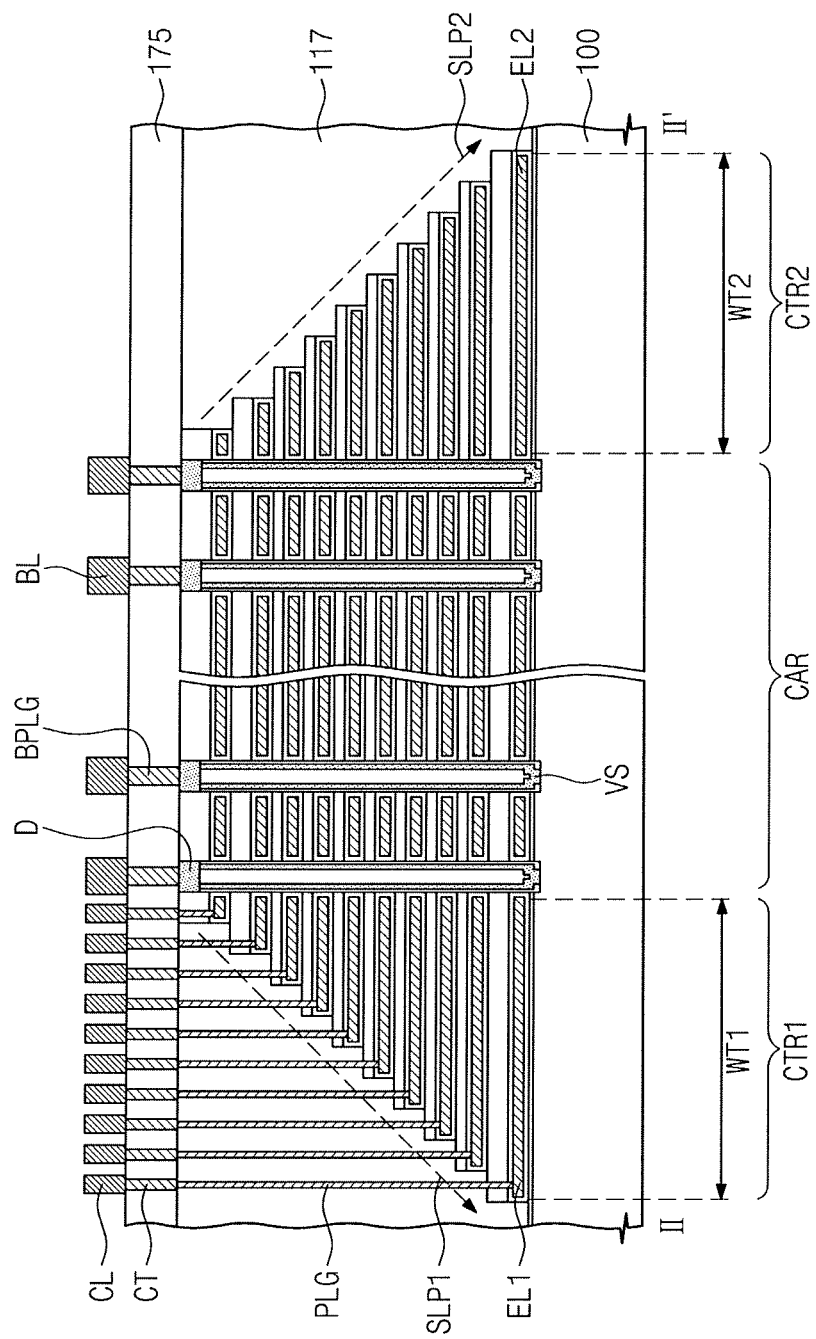
FIG. 11 is a sectional view, taken along line II-II', of the three-dimensional semiconductor memory device of FIG. 9A.
Figure 12:
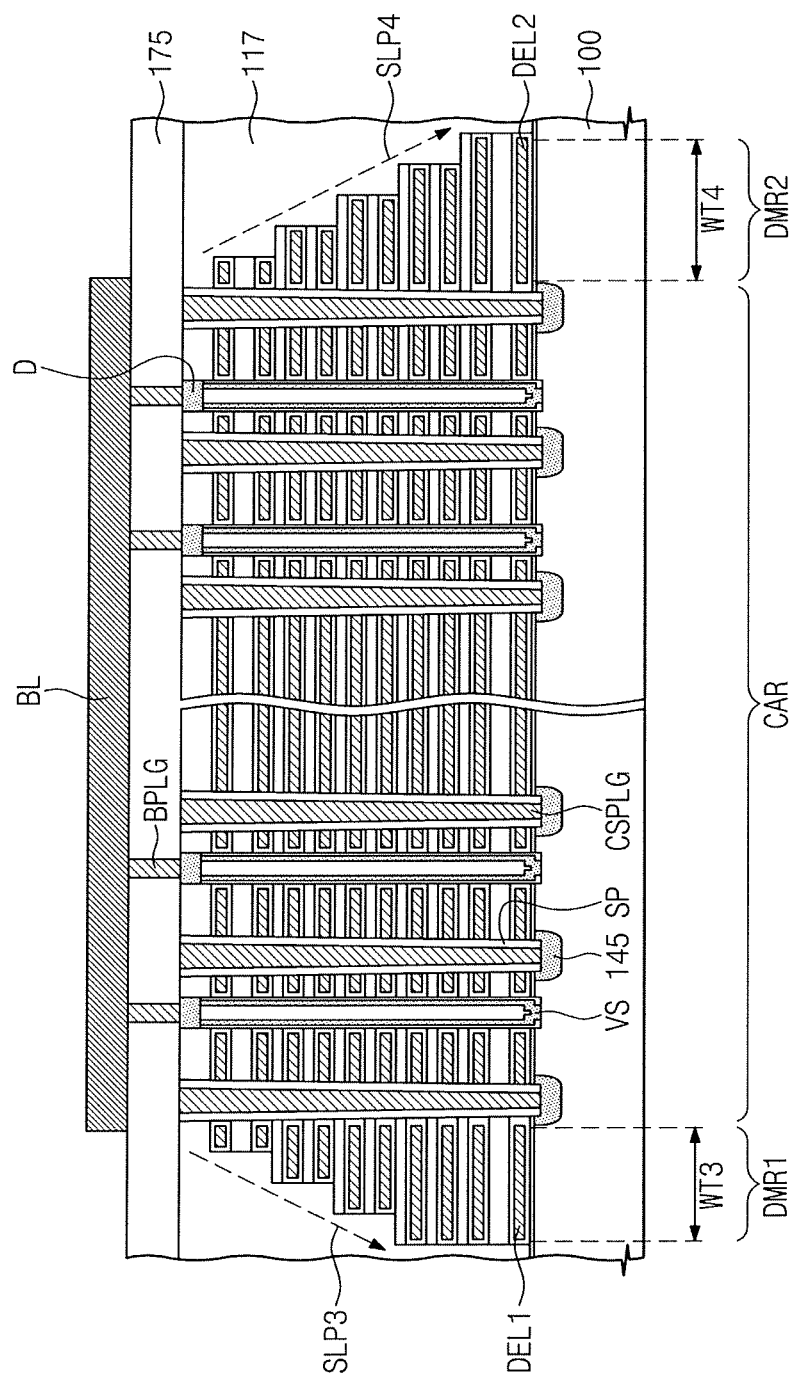
FIG. 12 is a sectional view, taken along line III-III', of the three-dimensional semiconductor memory device of FIG. 9A.

FIG. 9A is a plan view illustrating a memory cell region of a three-dimensional semiconductor memory device according to other an exemplary embodiment of the inventive concept, and FIG. 9B is an enlarged perspective view illustrating a portion 'A' of FIG. 9A. FIGS. 10, 11, and 12 are sectional views, taken along lines I-I', II-II', and III-III', respectively, of the three-dimensional semiconductor memory device of FIG. 9A.

Referring to FIGS. 9A, 9B, 10, 11, and 12, a three-dimensional semiconductor memory device may include a substrate 100, a cell array structure including stack structures ST and vertical structures VS, common source regions 145, common source structures, interconnection structures, an insulating gapfill layer, a capping insulating layer, and bit lines BL.

The substrate 100 may include the cell array region CAR, the first and second contact regions CTR1 and CTR2 positioned at both sides of the cell array region CAR in a first direction D1, and the first and second dummy regions DMR1 and DMR2 positioned at both sides of the cell array region CAR in a second direction D2 perpendicular to the first direction D1.

In an exemplary embodiment, the substrate 100, the cell array structure, the common source regions 145, the common source structures, the interconnection structures, the insulating gapfill layer, the capping insulating layer, and the bit lines BL, except for the electrodes of the stack structures ST, may be configured to have substantially the same features as those of the previous embodiments described with reference to FIGS. 5A, 5B, 6A, 6B, 7, and 8, and thus, such elements will be identified by a similar or identical reference number without repeating the descriptions thereof.

Hereinafter, the structure of the electrodes will be described with reference to FIGS. 9A, 9B, 10, 11, and 12.

The electrodes may include the first electrodes EL1 on the first contact region CTR1, the second electrodes EL2 on the second contact region CTR2, the first dummy electrodes DEL1 on the first dummy region DMR1, and the second dummy electrodes DEL2 on the second dummy region DMR2.

The first electrodes EL1 may be stacked to form a stepwise structure. For example, horizontal lengths of the first electrodes EL1 may increase in a stepwise manner with decreasing vertical distance from the substrate 100. For example, as shown in FIGS. 9A, 9B, 10, 11, and 12, the first electrodes EL1 may be stacked to form a stepwise structure with ten steps. The first ends of the first electrodes EL1 may be positioned in the first slope SLP1 with respect to the top surface of the substrate 100. The first contact region CTR1 may be provided to have the first width WT1.

The second electrodes EL2 may be stacked to form a stepwise structure. For example, horizontal lengths of the second electrodes EL2 may increase in a stepwise manner with decreasing vertical distance from the substrate 100. For example, as shown in FIGS. 9A, 9B, 10, 11, and 12, the second electrodes EL2 may be stacked to form a stepwise structure with ten steps. The second ends of the second electrodes EL2 may be positioned in the second slope SLP2 with respect to the top surface of the substrate 100. The second contact region CTR2 may be provided to have the second width WT2.

In an exemplary embodiment, a corresponding pair of the first and second electrodes EL1 and EL2 may be symmetrically disposed with respect to the cell array region CAR. The first and second slopes SLP1 and SLP2 may be substantially the same. The first and second widths WT1 and WT2 may be substantially the same.

At least two of the third ends of the first dummy electrodes DEL1 may have the same horizontal position. For example, as shown in FIGS. 9A, 9B, 10, 11, and 12, the third ends of two first dummy electrodes DEL1 which are vertically adjacent to each other may have substantially the same horizontal position. The first dummy electrodes DEL1 may be stacked to form a stepwise structure with five steps. The third ends of the first dummy electrodes DEL1 may be positioned in the third slope SLP3 with respect to the top surface of the substrate 100. The first dummy region DMR1 may be provided to have a third width WT3.

At least two of the fourth ends of the second dummy electrodes DEL2 may have the same horizontal position. For example, as shown in FIGS. 9A, 9B, 10, 11, and 12, the fourth ends of two second dummy electrodes DEL2 which are vertically adjacent to each other may have substantially the same horizontal position. The second dummy electrodes DEL2 may be stacked to form a stepwise structure with four steps. The fourth ends of the second dummy electrodes DEL2 may be positioned in the fourth slope SLP4 with respect to the top surface of the substrate 100. The second dummy region DMR2 may be provided to have a fourth width WT4.

In an exemplary embodiment, the first dummy electrodes DEL1 and the second dummy electrodes DEL2 may be asymmetrically disposed with respect to the cell array region CAR. For example, the third and fourth slopes SLP3 and SLP4 may be different from each other. For example, the fourth slope SLP4 may be greater than the third slope SLP3, and the third and fourth widths WT3 and WT4 may be different from each other. As an example, the third width WT3 may be greater than the fourth width WT4.

In an exemplary embodiment, the first slope SLP1 may be smaller than the third slope SLP3, and the third width WT3 may be smaller than the first width WT1.

In an exemplary embodiment, the contact plugs PLG of the interconnection structure may be respectively connected to the first electrodes EL1 of the first contact region CTR1. Although not shown, depending on configuration of the interconnection structure, the second electrodes EL2 of the second contact region CTR2 may also be electrically connected to the interconnection structure. At least two of the first and second dummy electrodes DEL1 and DEL2 may be stacked in a vertically aligned manner on the first and second dummy regions DMR1 and DMR2. The interconnection structure need not be formed in the first and second dummy regions DMR1 and DMR2 to reduce the area of the first and second dummy regions DMR1 and DMR2, and to increase the effective area of the cell array region CAR.

Figure 13A:
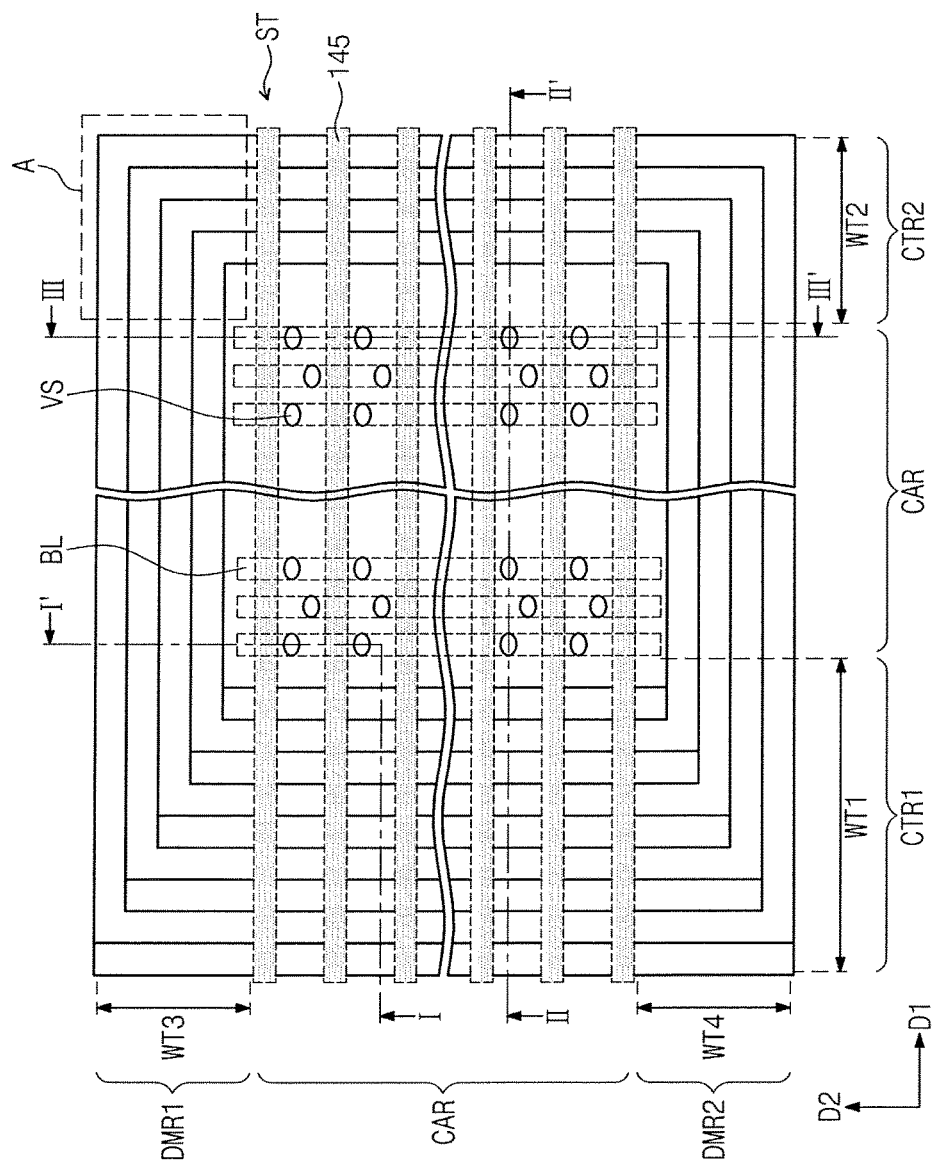
FIG. 13A is a plan view illustrating a memory cell region of a three-dimensional semiconductor memory device according to still other an exemplary embodiment of the inventive concept.
Figure 13B:
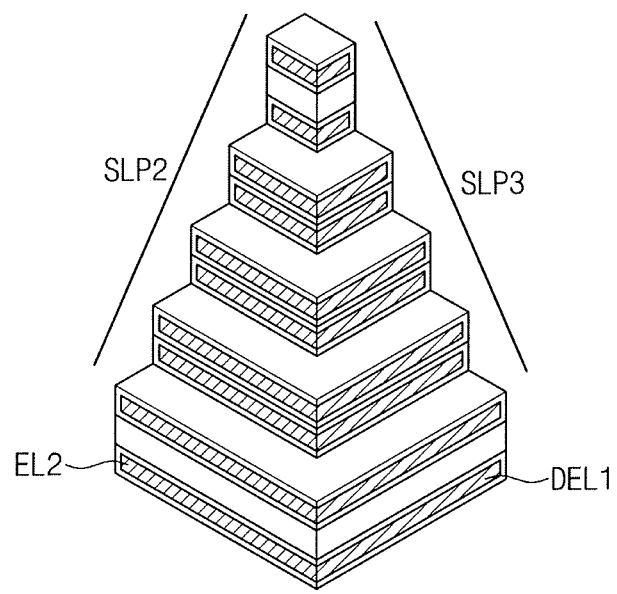
FIG. 13B is an enlarged perspective view illustrating a portion 'A' of FIG. 13A.
Figure 14:
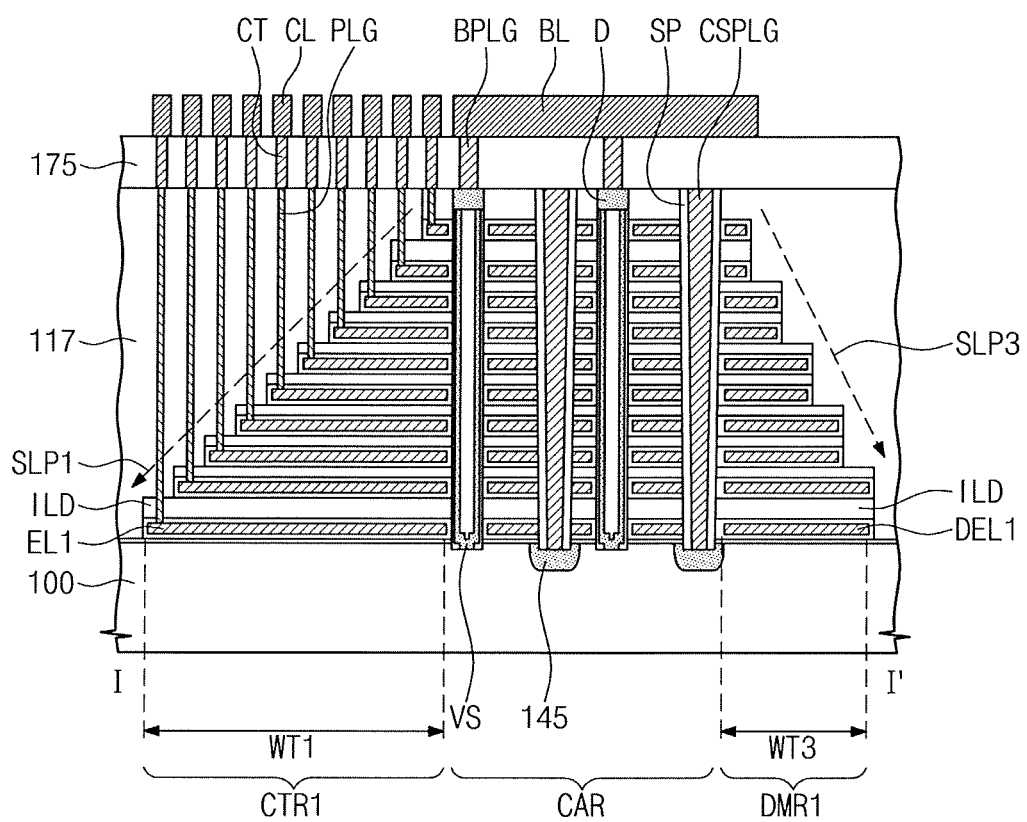
FIG. 14 is a sectional view, taken along line I-I', of the three-dimensional semiconductor memory device of FIG. 13A.
Figure 15:
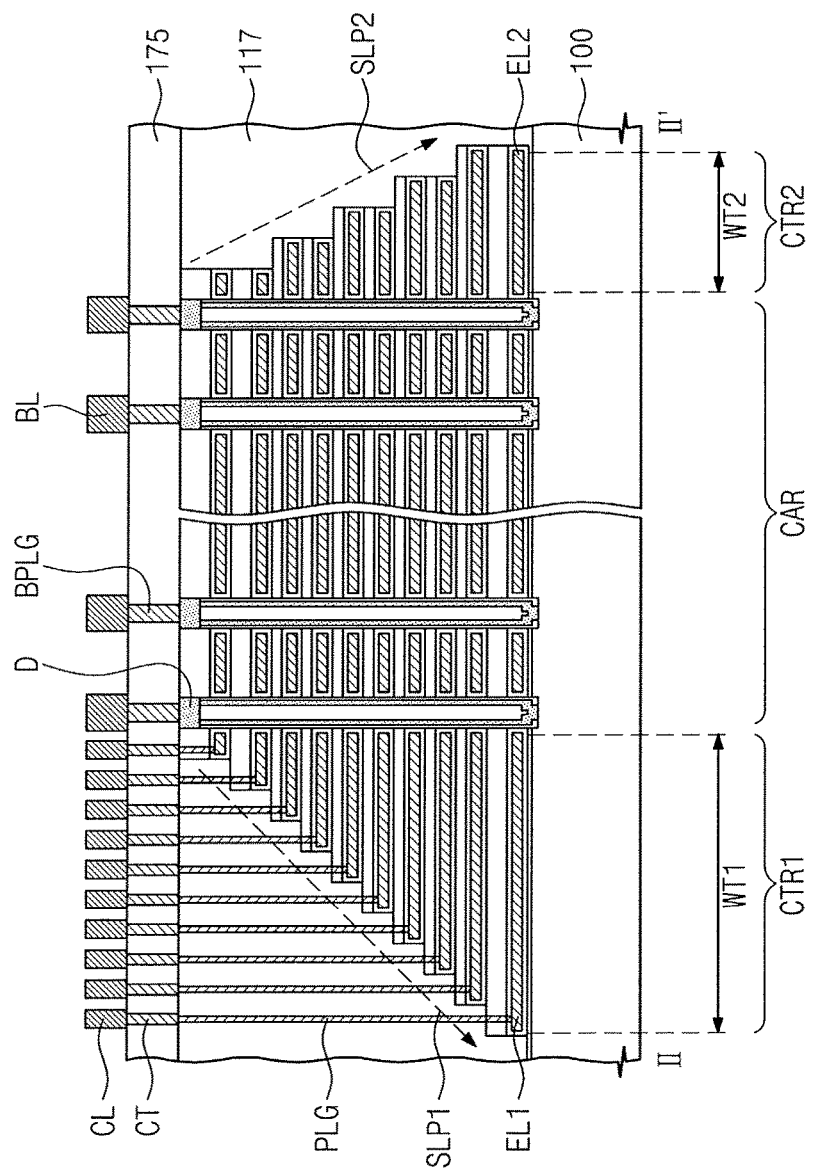
FIG. 15 is a sectional view, taken along line II-II', of the three-dimensional semiconductor memory device of FIG. 13A.
Figure 16:
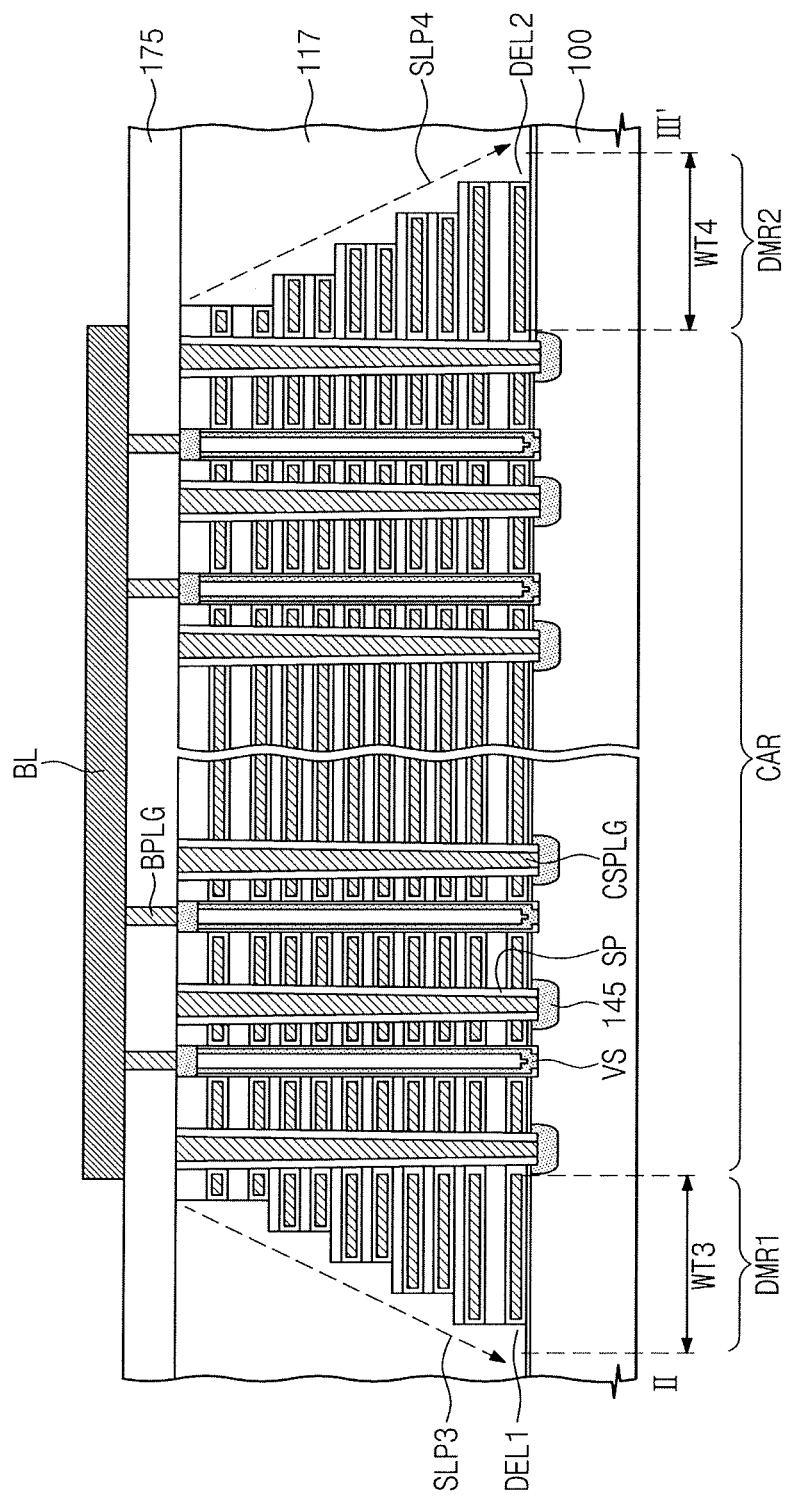
FIG. 16 is a sectional view, taken along line III-III', of the three-dimensional semiconductor memory device of FIG. 13A.

FIG. 13A is a plan view illustrating a memory cell region of a three-dimensional semiconductor memory device according to an exemplary embodiment of the inventive concept, and FIG. 13B is an enlarged perspective view illustrating a portion 'A' of FIG. 13A. FIGS. 14, 15, and 16 are sectional views, taken along lines I-I', II-II', and III-III', respectively, of the three-dimensional semiconductor memory device of FIG. 13A.

Referring to FIGS. 13A, 13B, 14, 15, and 16, a three-dimensional semiconductor memory device may include a substrate 100, a cell array structure including stack structures ST and vertical structures VS, common source regions 145, common source structures, interconnection structures, an insulating gapfill layer, a capping insulating layer, and bit lines BL.

The substrate 100 may include the cell array region CAR, the first and second contact regions CTR1 and CTR2 positioned at both sides of the cell array region CAR in a first direction D1, and the first and second dummy regions DMR1 and DMR2 positioned at both sides of the cell array region CAR in a second direction D2 perpendicular to the first direction D1.

In an exemplary embodiment, the substrate 100, the cell array structure, the common source regions 145, the common source structures, the interconnection structures, the insulating gapfill layer, the capping insulating layer, and the bit lines BL, except for the electrodes of the stack structures ST, may be configured to have substantially the same features as those of the previous embodiments described with reference to FIGS. 5A, 5B, 6A, 6B, 7, and 8, and thus, such elements will be identified by a similar or identical reference number without repeating the descriptions thereof.

Hereinafter, the structure of the electrodes will be described with reference to FIGS. 13A, 13B, 14, 15, and 16.

The electrodes may include the first electrodes EL1 on the first contact region CTR1, the second electrodes EL2 on the second contact region CTR2, the first dummy electrodes DEL1 on the first dummy region DMR1, and the second dummy electrodes DEL2 on the second dummy region DMR2.

The first electrodes EL1 may be stacked to form a stepwise structure. For example, horizontal lengths of the first electrodes EL1 may increase in a stepwise manner with decreasing vertical distance from the substrate 100. For example, the first electrodes EL1 may be stacked to form a stepwise structure with ten steps. The first ends of the first electrodes EL1 may be positioned in the first slope SLP1 with respect to the top surface of the substrate 100. The first contact region CTR1 may be provided to have the first width WT1.

At least two of the second ends of the second electrodes EL2 may have the same horizontal position. For example, the second electrodes EL2 may be stacked to form a stepwise structure with five steps. The second ends of the second electrodes EL2 may be positioned in the second slope SLP2 with respect to the top surface of the substrate 100. The second contact region CTR2 may be provided to have the second width WT2.

In an exemplary embodiment, the first electrodes EL1 and the second electrodes EL2 may be asymmetrically disposed with respect to the cell array region CAR. For example, the first and second slopes SLP1 and SLP2 may be different from each other. For example, the first slope SLP1 may be smaller than the second slope SLP2. In an exemplary embodiment, the first and second widths WT1 and WT2 may be different from each other. For example, the first width WT1 may be greater than the second width WT2.

At least two of the third ends of the first dummy electrodes DEL1 may have the same horizontal position. For example, the third ends of two first dummy electrodes DEL1 which are vertically adjacent to each other may have substantially the same horizontal position. For example, the first dummy electrodes DEL1 may be stacked to form a stepwise structure with five steps. The third ends of the first dummy electrodes DEL1 may be positioned in the third slope SLP3 with respect to the top surface of the substrate 100. The first dummy region DMR1 may be provided to have the third width WT3.

At least two of the fourth ends of the second dummy electrodes DEL2 may have the same horizontal position. For example, the fourth ends of twp second dummy electrodes DEL2 which are vertically adjacent to each other may have substantially the same horizontal position. The second dummy electrodes DEL2 may be stacked to form a stepwise structure with five steps. The second dummy electrodes DEL2 of the second dummy electrodes DEL2 may be positioned in the fourth slope SLP4 with respect to the top surface of the substrate 100. The second dummy region DMR2 may be provided to have the fourth width WT4.

In an exemplary embodiment, the first dummy electrodes DEL1 and the second dummy electrodes DEL2 may be symmetrically disposed with respect to the cell array region CAR. The third and fourth slopes SLP3 and SLP4 may be substantially the same. The third and fourth widths WT3 and WT4 may be substantially the same.

In an exemplary embodiment, the first slope SLP1 may be smaller than the third slope SLP3, and the second slope SLP2 may be substantially the same as the third and fourth slopes SLP3 and SLP4. The first width WT1 may be greater than the third width WT3, and the second width WT2 may be substantially equal to third and fourth widths WT3 and WT4.

In an exemplary embodiment, as shown in FIGS. 9A, 9B, 10, 11, and 12, the first and second dummy electrodes DEL1 and DEL2 may be asymmetrically disposed with respect to the cell array region CAR. For example, the third and fourth slopes SLP3 and SLP4 may be different from each other. In an exemplary embodiment, the fourth slope SLP4 may be greater than the third slope SLP3. Also, the third and fourth widths WT3 and WT4 may be different from each other. For example, the third width WT3 may be greater than the fourth width WT4.

In an exemplary embodiment, the contact plugs PLG of the interconnection structure may be respectively connected to the first electrodes EL1 of the first contact region CTR1. At least two of the second electrodes EL2 may be stacked in a vertically aligned manner on the second contact region CTR2. The interconnection structure need not be formed in the second contact region CTR2 to reduce the area of the second electrodes EL2. At least two of the first and second dummy electrodes DEL1 and DEL2 may be stacked in a vertically aligned manner on the first and second dummy regions DMR1 and DMR2. The interconnection structure need not be formed in the first and second dummy regions DMR1 and DMR2 to reduce the area of the first and second dummy regions DMR1 and DMR2 and to increase the effective area of the cell array region CAR.

FIGS. 17 through 24 are sectional views illustrating a method of fabricating a three-dimensional semiconductor device, according to an exemplary embodiment of the inventive concept. FIGS. 17 through 24 are sectional views taken along I-I' of FIG. 5A.

Figure 17:
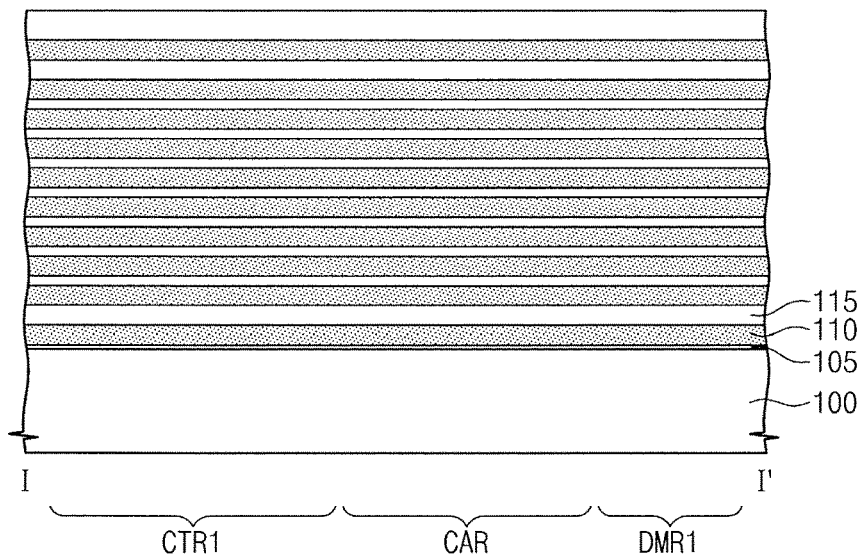
FIGS. 17 through 24 are sectional views illustrating a method of fabricating a three-dimensional semiconductor device, according to an exemplary embodiment of the inventive concept.

Referring to FIG. 17, a buffer insulating layer 105 may be formed on the substrate 100, and sacrificial layers 110 and insulating layers 115 may be alternately formed on the buffer insulating layer 105.

The substrate 100 may include the cell array region CAR and the first and second contact regions CTR1 and CTR2 and the first and second dummy regions DMR1 and DMR2 surrounding the cell array region CAR. Here, the first and second contact regions CTR1 and CTR2 may be provided opposite to each other, and the first and second dummy regions DMR1 and DMR2 may be provided opposite to each other.

The sacrificial layers 110 may be formed of a material having etch selectivity with respect to the buffer insulating layer 105 and the insulating layers 115. For example, the buffer insulating layer 105 and the insulating layers 115 may be formed of or include silicon oxide, and the sacrificial layers 110 may be formed of or include silicon nitride.

Figure 18:
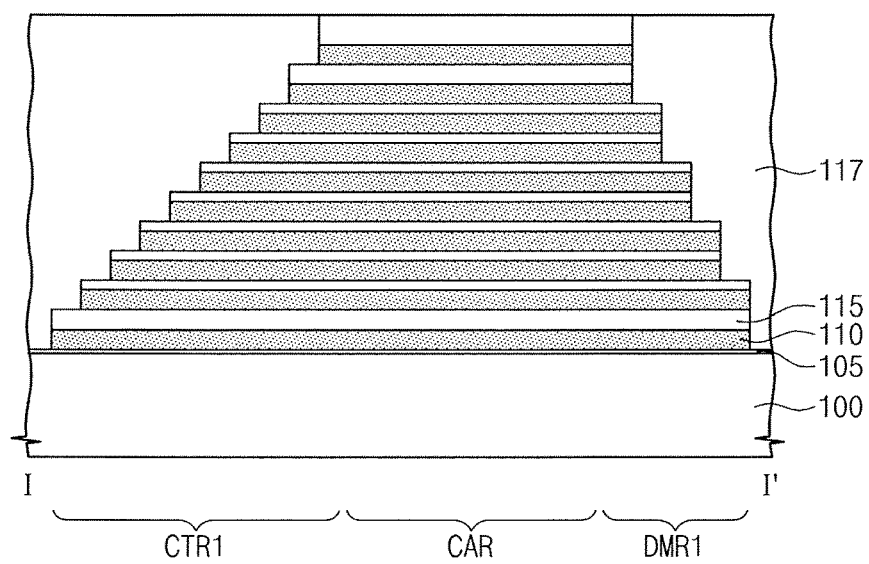

Referring to FIG. 18, the sacrificial layers 110 and the insulating layers 115 on the first and second contact regions CTR1 and CTR2 and the first and second dummy regions DMR1 and DMR2 may be patterned to form a stepwise structure.

For example, a mask pattern (not shown) may be formed on the uppermost one of the insulating layers 115, and the uppermost layers of the insulating and sacrificial layers 115 and 110 may be etched using the mask pattern as an etch mask to expose the second uppermost layer of the insulating layers 115. Thereafter, the mask pattern may be etched to reduce a width of the mask pattern, and the second uppermost layers of the insulating and sacrificial layers 115 and 110 may be etched using the etched mask pattern as an etch mask. The etching process on the insulating and sacrificial layers 115 and 110 and the etching process on the mask pattern may be repeatedly performed, and thus, the insulating and sacrificial layers 115 and 110 may be formed to have a stepwise structure on the first and second contact regions CTR1 and CTR2 and the first and second dummy regions DMR1 and DMR2.

In an exemplary embodiment, various stepwise structures as shown in FIGS. 5A, 9A, and 13A may be formed by controlling positions and areas of the first and second contact regions CTR1 and CTR2 and the first and second dummy regions DMR1 and DMR2 covered with the mask pattern.

After the etching process, the mask pattern may be removed, and then, an insulating gapfill layer 117 may be formed on the substrate 100. The insulating gapfill layer 117 may be planarized to expose a top surface of the uppermost layer of the insulating layers 115.

Figure 19:
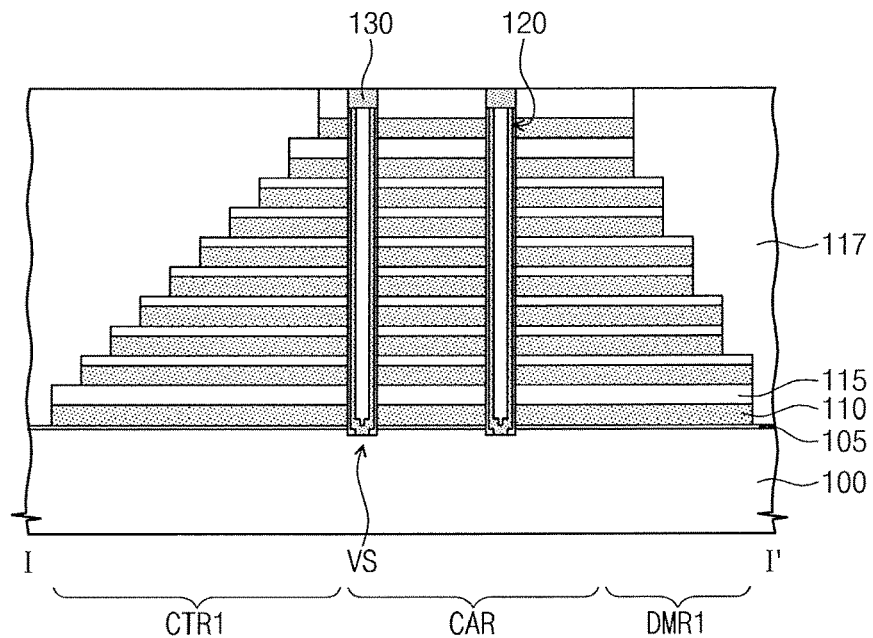

Referring to FIG. 19, the insulating layers 115, the sacrificial layers 110, and the buffer insulating layer 105 on the cell array region CAR may be patterned to form vertical holes 120 exposing the substrate 100. For example, the vertical holes 120 may be arranged in a zigzag manner, when viewed in a plan view. In an exemplary embodiment, the vertical holes 120 may be arranged in a linear manner, when viewed in a plan view.

Thereafter, the vertical structures VS may be formed to fill the vertical holes 120, respectively. The formation of the vertical structures VS (e.g., shown in FIG. 6B) may include forming the second semiconductor pattern SP2 to cover inner side surfaces of the vertical holes 120, forming the first semiconductor pattern SP1 to cover the vertical holes 120 provided with the second semiconductor pattern SP2, and forming conductive pads D (e.g., see FIG. 4) on the first and second semiconductor patterns SP1 and SP2. Each of the conductive pads D may be a doped region, which may be formed by an implantation process, or a conductive pattern, which may be formed by a deposition process. Furthermore, the first semiconductor pattern SP1 may be a hollow structure with a closed bottom.

Figure 20:
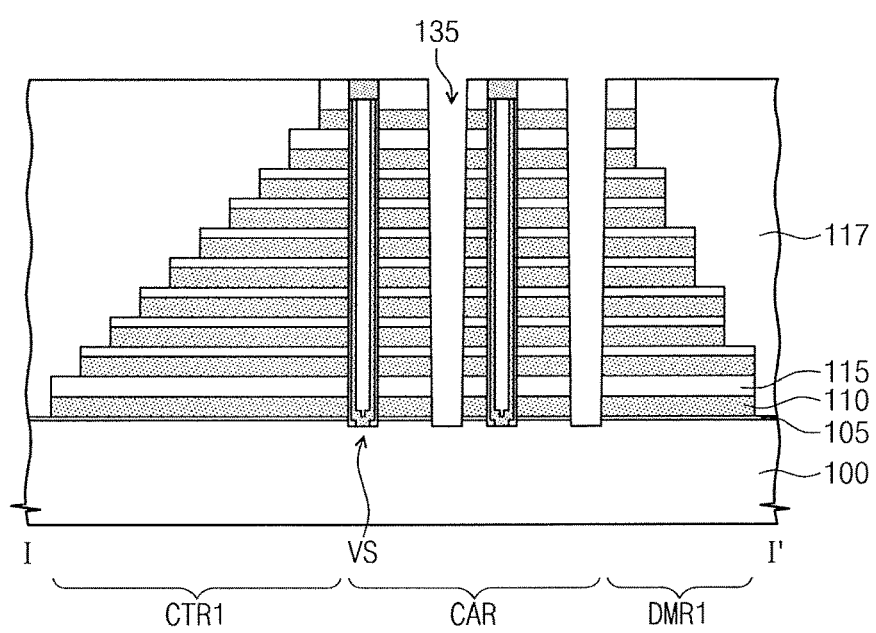

Referring to FIG. 20, the insulating gapfill layer 117, the insulating layers 115, the sacrificial layers 110, and the buffer insulating layer 105 may be patterned to form trenches 135 exposing the substrate 100. Side surfaces of the insulating and sacrificial layers 115 and 110 may be exposed by the trenches 135.

Figure 21:
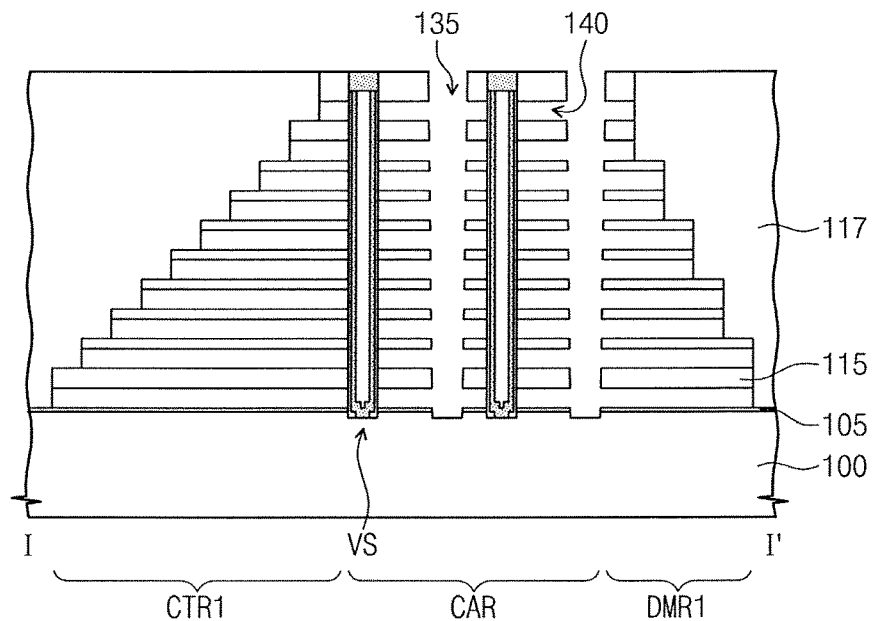

Referring to FIG. 21, the sacrificial layers 110 exposed by the trenches 135 may be removed to form recesses 140 between the insulating layers 115. The recesses 140 may be connected to the trenches 135. In an exemplary embodiment, the removal of the sacrificial layers 110 may be performed using an isotropic etching process.

Figure 22:
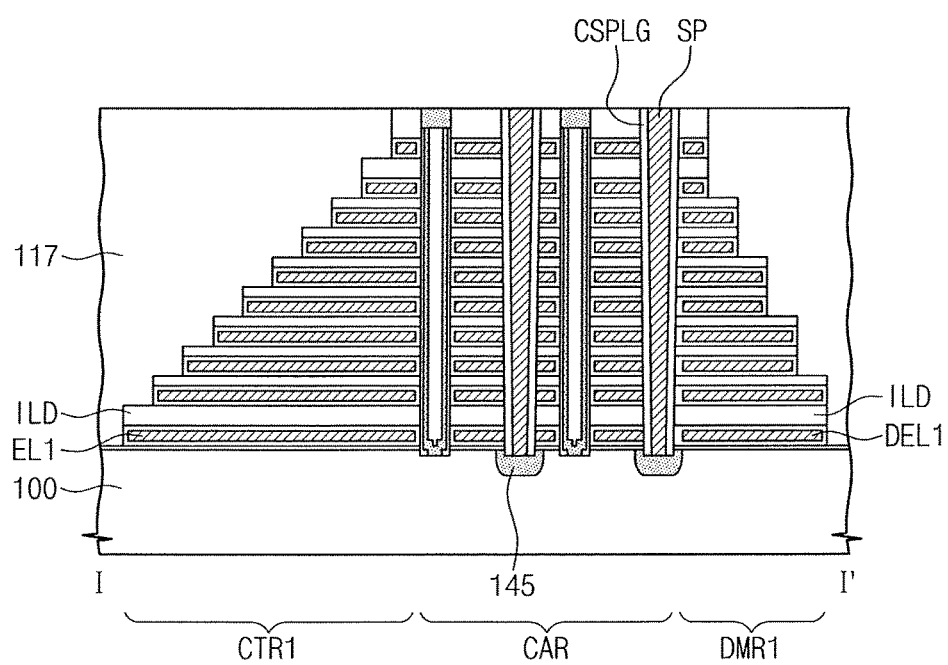

Referring to FIG. 22, a first conductive layer (not shown) may be formed on the substrate 100 to fill the trenches 135 and the recesses 140. The first conductive layer may include a barrier layer (not shown) conformally covering inner surfaces of the trenches 135 and the recesses 140 and an electrode layer (not shown) filling remaining spaces of the trenches 135 and the recesses 140. The first conductive layer may be removed from the trenches 135, and as a result, the electrodes EL may be locally formed in the recesses 140, respectively.

In an exemplary embodiment, the electrodes EL may be classified into four types, according to their positions. For example, the electrodes EL may include the first electrodes EL1, the second electrodes EL2, the first dummy electrodes DEL1, and the second dummy electrodes DEL2.

In the case where the vertical structures VS are formed to have a structure shown in FIG. 6B, the vertical pattern VP of the data storing layer DS may be conformally formed between the second semiconductor pattern SP2 and the stack structures ST.

Thereafter, an ion implantation process may be performed to inject dopants into the substrate 100 exposed by the trenches 135 and thereby to form the common source regions 145. In an exemplary embodiment, the common source regions 145 may be formed after the formation of the electrodes EL. In an exemplary embodiment, the common source regions 145 may be formed after the formation of the trenches 135 and before the removal of the sacrificial layers 110.

The common source structures may be formed in the trenches 135 to provide current paths for electric connection to the common source regions 145. The formation of the common source structures may include conformally forming an insulating spacer layer (not shown) on sidewalls of the trenches 135, anisotropically etching the insulating spacer layer to form the insulating sidewall spacer SP exposing the common source regions 145, forming a second conductive layer to fill the trenches 135 provided with the insulating sidewall spacer SP, and then, planarizing the second conductive layer to form the common source plugs CSPLG.

Figure 23:
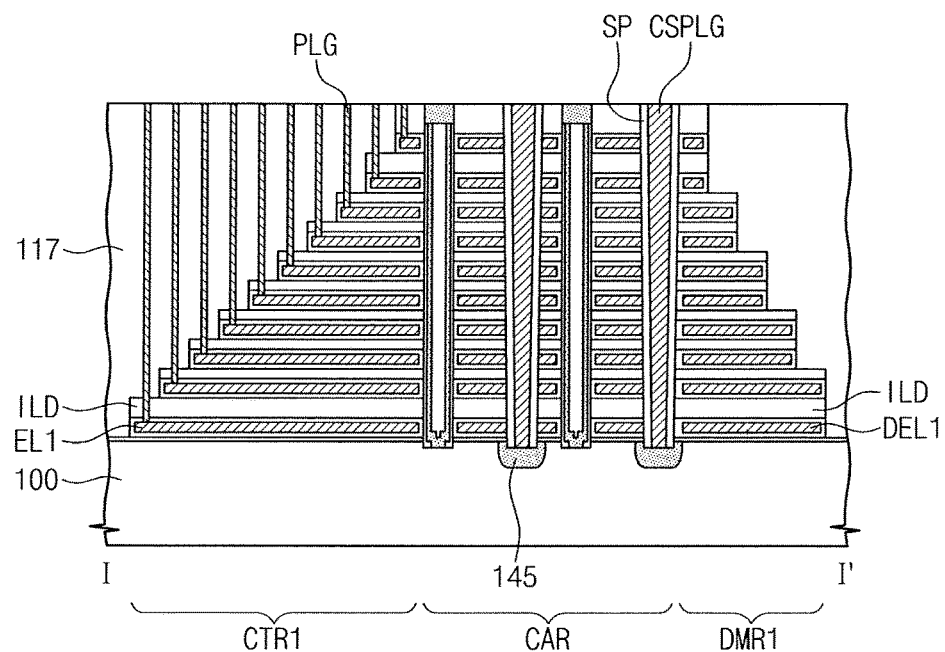

Referring to FIG. 23, the contact plugs PLG may be formed to penetrate the insulating gapfill layer 117 on at least one of the first and second contact regions CTR1 and CTR2. For example, the contact plugs PLG formed on the first contact region CTR1 may be electrically connected to the first electrodes EL1. In an exemplary embodiment, the contact plugs PLG may be formed on the first and second contract regions CTR1 and CTR2, and may be electrically connected to the first and second electrodes EL1 and EL2, respectively.

As shown in FIGS. 6A, 7, and 8, the contact plugs PLG may be electrically connected to the first ends of the first electrodes EL1, respectively. Although not shown, in an exemplary embodiment, the contact plugs PLG may be electrically connected to the second ends of the second electrodes EL2, respectively.

Figure 24:
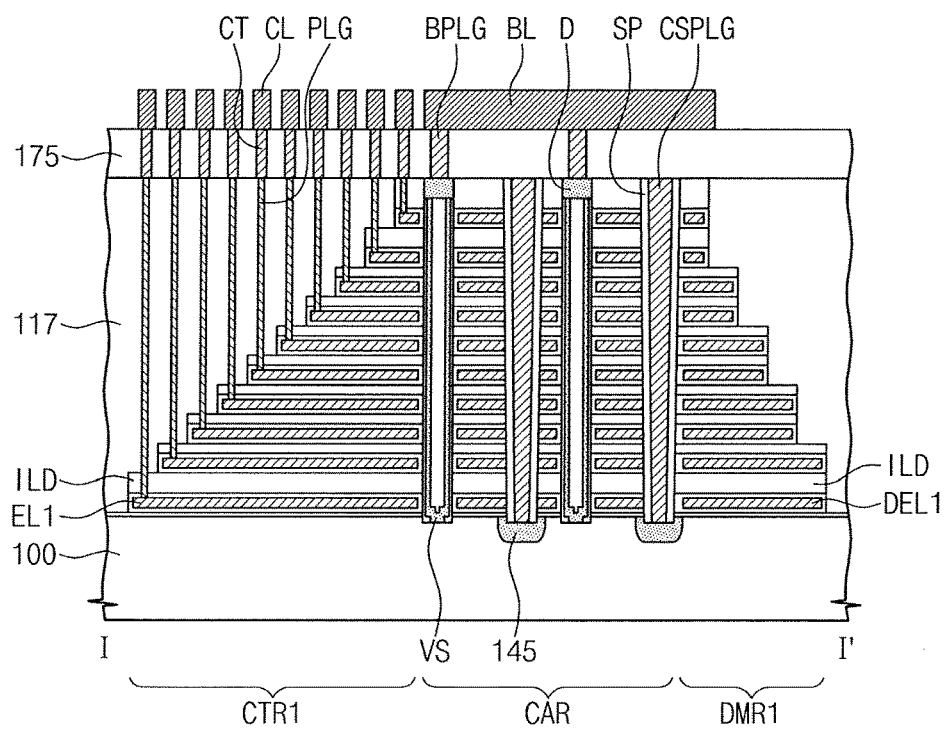

Referring to FIG. 24, a capping insulating layer 175 may be formed on the substrate 100 to cover the vertical structures VS, the common source structure, the contact plugs PLG, and the insulating gapfill layer 117.

Thereafter, the bit line contact plugs BPLG may be formed to penetrate the capping insulating layer 175. The bit line contact plugs BPLG may be electrically connected to the vertical structures VS, respectively. Next, the contact patterns CT may be formed to be electrically connected to the contact plugs PLG, respectively.

The bit line BL may be formed on the capping insulating layer 175 to be electrically connected to the bit line contact plugs BPLG, and the connection lines CL may be formed to be electrically connected to the contact patterns CT.

According to an exemplary embodiment of the inventive concept, in a stack structure of vertically-stacked electrodes, a dummy region is provided to have a reduced area, and thus, the effective area of a cell array region may increase.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A three-dimensional semiconductor device, comprising:
a substrate including a cell array region, a dummy region, a contact region, and an overlapped region,
the contact region being adjacent to the cell array region in a first direction, the dummy region being adjacent to the cell array region in a second direction, the overlapped region being adjacent to the contact region in the second direction and adjacent to the dummy region in the first direction, the second direction being perpendicular to the first direction;
a first stack structure including a plurality of first electrodes vertically stacked on the substrate, the first stack structure extending along the first direction on the cell array region and the contact region; and
a second stack structure including a plurality of second electrodes vertically stacked on the substrate, the second stack structure spaced apart from the first stack structure in the second direction and provided on the dummy region and the overlapped region,
wherein each of the plurality of second electrodes has a first sidewall on the overlapped region and a second sidewall on the dummy region,
the first sidewalk of the plurality of second electrodes are spaced apart from each other, in the first direction, and
the second sidewalls of two of the plurality of second electrodes vertically adjacent to each other are vertically aligned with each other, in the second direction.

2. The three-dimensional semiconductor device of claim 1, wherein
the first sidewalls of the plurality of second electrodes are spaced apart from each other by a first horizontal distance,
the second sidewalls of the plurality of second electrodes, which are vertically adjacent to each other and at the same distance from an edge of the dummy region as each other, form pairs, and the pairs of the second sidewalls of the plurality of second electrodes are at heights different from each other, are spaced apart from each other by a second horizontal distance.

3. The three-dimensional semiconductor device of claim 1, wherein each of the plurality of second electrodes has a third sidewall facing one sidewall of the first stack structure,
the third sidewalls of the plurality of second electrodes are vertically aligned with each other, on the dummy region.

4. The three-dimensional semiconductor device of claim 3, wherein the second and third sidewalls of the plurality of second electrodes are substantially parallel to the first direction.

5. The three-dimensional semiconductor device of claim 1, wherein sidewalls of the plurality of first electrodes are spaced apart from each other in the first direction.

6. The three-dimensional semiconductor device of claim 5, further comprising contact plugs connected to the plurality of first electrodes, respectively, on the contact region.

7. The three-dimensional semiconductor device of claim 1, further comprising:
vertical structures penetrating the first stack structure on the cell array region; and
memory elements between the vertical structures and the plurality of first electrodes.

8. A three-dimensional semiconductor device, comprising:
a substrate including a cell array region, a dummy region, a contact region, and an overlapped region,
the contact region being adjacent to the cell array region in a first direction, the dummy region being adjacent to the cell array region in a second direction, the overlapped region being adjacent to the contact region in the second direction and adjacent to the dummy region in the first direction, the second direction being perpendicular to the first direction;
a first stack structure including a plurality of first electrodes vertically stacked on the substrate, the first stack structure extending along the first direction on the cell array region and the contact region; and
a second stack structure including a plurality of second electrodes vertically stacked on the substrate, the second stack structure spaced apart from the first stack structure in the second direction and provided on the dummy region and the overlapped region,
wherein the second stack structure has a first staircase structure extending in the first direction and a second staircase structure extending in the second direction,
the first staircase structure has a first slope with respect to the top surface of the substrate and the second staircase structure has a second slope with respect to the top surface of the substrate, and
the second slope is greater than the first slope.

9. The three-dimensional semiconductor device of claim 8, wherein each of the plurality of second electrodes has a first sidewall on the overlapped region and a second sidewall on the dummy region,
the first sidewalk of the plurality of second electrodes are spaced apart from each other, in the first direction, and
the second sidewalls of two of the plurality of second electrodes vertically adjacent to each other are vertically aligned with each other, in the second direction.

10. The three-dimensional semiconductor device of claim 8, wherein each of the plurality of second electrodes has a third sidewall facing one sidewall of the first stack structure,
the third sidewalls of the plurality of second electrodes are vertically aligned with each other, on the dummy region.

11. The three-dimensional semiconductor device of claim 10, wherein the second and third sidewall of the plurality of second electrodes are substantially parallel to the first direction.

12. The three-dimensional semiconductor device of claim 8, further comprising a common source region provided in the substrate between the first stack structure and the second stack structure,
wherein the common source region extends in the first direction.

* * * * *